United States Patent
Yamamoto et al.

(10) Patent No.: US 9,449,853 B2
(45) Date of Patent: Sep. 20, 2016

(54) METHOD FOR MANUFACTURING SEMICONDUCTOR DEVICE COMPRISING ELECTRON TRAP LAYER

(71) Applicant: Semiconductor Energy Laboratory Co., Ltd., Atsugi-shi, Kanagawa-ken (JP)

(72) Inventors: Yoshitaka Yamamoto, Yamatokoriyama (JP); Tetsuhiro Tanaka, Atsugi (JP); Takayuki Inoue, Sagamihara (JP); Hideomi Suzawa, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/471,766

(22) Filed: Aug. 28, 2014

(65) Prior Publication Data
US 2015/0060846 A1    Mar. 5, 2015

(30) Foreign Application Priority Data

Sep. 4, 2013   (JP) .................................. 2013-182664

(51) Int. Cl.
*H01L 21/336*   (2006.01)
*H01L 21/441*   (2006.01)
(Continued)

(52) U.S. Cl.
CPC ......... *H01L 21/473* (2013.01); *H01L 21/0214* (2013.01); *H01L 21/02181* (2013.01);
(Continued)

(58) Field of Classification Search
CPC ......... H01L 29/792–29/7926; H01L 29/7869; H01L 29/66833; H01L 21/2855
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Chang, Chia-Hua and Jenn-Gwo Hwu, "Trapping characteristics of Al2O3/HfO2/SiO2Al2O3/HfO2/SiO2 stack structure prepared by low temperature in situ oxidation in dc sputtering", J. Appl. Phys. 105, 094103 (2009).*

(Continued)

*Primary Examiner* — Victor A Mandala
*Assistant Examiner* — Regan J Rundio
(74) *Attorney, Agent, or Firm* — Robinson Intellectual Property Law Office; Eric J. Robinson

(57) ABSTRACT

A semiconductor device in which the threshold is adjusted is provided. In a transistor including a semiconductor, a source or drain electrode electrically connected to the semiconductor, a gate electrode, and an electron trap layer between the gate electrode and the semiconductor, the electron trap layer includes crystallized hafnium oxide. The crystallized hafnium oxide is deposited by a sputtering method using hafnium oxide as a target. When the substrate temperature is Tsub (° C.) and the proportion of oxygen in an atmosphere is P (%) in the sputtering method, P≥45−0.15×Tsub is satisfied. The crystallized hafnium oxide has excellent electron trapping properties. By the trap of an appropriate number of electrons, the threshold of the semiconductor device can be adjusted.

14 Claims, 22 Drawing Sheets

(51) Int. Cl.

| | | |
|---|---|---|
| *H01L 21/473* | (2006.01) | |
| *H01L 29/786* | (2006.01) | |
| *H01L 29/51* | (2006.01) | |
| *H01L 21/02* | (2006.01) | |
| *H01L 29/66* | (2006.01) | |
| *H01L 29/423* | (2006.01) | |
| *H01L 21/28* | (2006.01) | |
| *H01L 29/792* | (2006.01) | |
| *H01L 21/311* | (2006.01) | |
| *H01L 21/3213* | (2006.01) | |
| *H01L 21/465* | (2006.01) | |
| *H01L 29/49* | (2006.01) | |
| *H01L 27/12* | (2006.01) | |
| *H01L 21/316* | (2006.01) | |

(52) U.S. Cl.
CPC ... *H01L21/02266* (2013.01); *H01L 21/02274* (2013.01); *H01L 21/28194* (2013.01); *H01L 21/31116* (2013.01); *H01L 21/31122* (2013.01); *H01L 21/32136* (2013.01); *H01L 21/465* (2013.01); *H01L 29/42384* (2013.01); *H01L 29/4908* (2013.01); *H01L 29/517* (2013.01); *H01L 29/66969* (2013.01); *H01L 29/7869* (2013.01); *H01L 29/78648* (2013.01); *H01L 29/78693* (2013.01); *H01L 29/78696* (2013.01); *H01L 29/792* (2013.01); *H01L 21/28282* (2013.01); *H01L 21/31645* (2013.01); *H01L 27/1225* (2013.01)

(56) References Cited

U.S. PATENT DOCUMENTS

| | | |
|---|---|---|
| 5,902,650 A | 5/1999 | Feng et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,365,363 B2 * | 4/2008 | Kojima ............ H01L 21/02024 257/328 |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,692,223 B2 | 4/2010 | Isobe et al. |
| 7,732,819 B2 | 6/2010 | Akimoto et al. |
| 7,791,072 B2 | 9/2010 | Kumomi et al. |
| 7,910,970 B2 * | 3/2011 | Takayanagi ....... H01L 21/28282 257/296 |
| 8,237,166 B2 | 8/2012 | Kumomi et al. |
| 8,378,351 B2 | 2/2013 | Fukumoto et al. |
| 8,384,080 B2 | 2/2013 | Taniguchi et al. |
| 8,389,991 B2 | 3/2013 | Morosawa et al. |
| 8,547,771 B2 | 10/2013 | Koyama |
| 8,692,252 B2 | 4/2014 | Takata et al. |
| 8,796,755 B2 * | 8/2014 | Sato .................... H01L 29/788 257/316 |
| 9,129,937 B2 * | 9/2015 | Hayashi ............ H01L 21/28282 257/43 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2003/0235076 A1 | 12/2003 | Forbes |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0205969 A1 * | 9/2005 | Ono ................ H01L 21/28282 257/645 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0249780 A1 | 11/2006 | Mori |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0096929 A1 | 4/2008 | Shih et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0230831 A1 | 9/2008 | Noda et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0296650 A1 | 12/2008 | Ahn et al. |
| 2009/0050954 A1 * | 2/2009 | Choi ..................... H01L 29/792 257/324 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0059744 A1 * | 3/2010 | Yin ..................... H01L 21/84 257/43 |

(56) References Cited

U.S. PATENT DOCUMENTS

| | | | |
|---|---|---|---|
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0304529 A1 | 12/2010 | Sasaki et al. | |
| 2011/0140100 A1* | 6/2011 | Takata | H01L 29/78696 257/43 |
| 2011/0240987 A1 | 10/2011 | Lee et al. | |
| 2011/0309876 A1 | 12/2011 | Terai et al. | |
| 2012/0001173 A1 | 1/2012 | Suzuki et al. | |
| 2012/0056175 A1 | 3/2012 | Takemura | |
| 2012/0132903 A1* | 5/2012 | Yamazaki | H01L 21/0242 257/43 |
| 2012/0146713 A1* | 6/2012 | Kim | H01L 29/41733 327/530 |
| 2012/0223305 A1 | 9/2012 | Sato et al. | |
| 2012/0235118 A1 | 9/2012 | Avouris et al. | |
| 2012/0248433 A1 | 10/2012 | Nakano et al. | |
| 2012/0286262 A1* | 11/2012 | Koyama | H01L 29/7869 257/43 |
| 2014/0097867 A1 | 4/2014 | Koyama | |
| 2015/0008428 A1 | 1/2015 | Yamamoto et al. | |
| 2015/0011046 A1* | 1/2015 | Tanaka | H01L 29/66969 438/104 |
| 2015/0024577 A1* | 1/2015 | Kato | G11C 16/0466 438/466 |
| 2015/0054548 A1 | 2/2015 | Kato et al. | |
| 2015/0069385 A1* | 3/2015 | Yamamoto | H01L 29/7869 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2011-124360 | 6/2011 |
| JP | 2011-138934 | 7/2011 |
| JP | 2012-074692 | 4/2012 |
| JP | 2012-257187 | 12/2012 |
| WO | WO-2004/114391 | 12/2004 |

OTHER PUBLICATIONS

Lee.K et al., "The effect of moisture on the photon-enhanced negative bias thermal instability in Ga—In—Zn—O thin film transistors", Appl. Phys. Lett. (Applied Physics Letters), Dec. 7, 2009, vol. 95, No. 23, pp. 232106-1-232106-3.

Blochl.P et al., "Hydrogen Electrochemistry and Stress-Induced Leakage Current in Silica", Phys. Rev. Lett. (Physical Review Letters), Jul. 12, 1999, vol. 83, No. 2, pp. 372-375.

Han.D et al., "Impurity doping in SiO2: Formation energies and defect levels from first-principles calculations", Phys. Rev. B (Physical Review. B), Oct. 22, 2010, vol. 82, No. 15, pp. 155132-1-155132-7.

Ryu.B et al., "O-vacancy as the origin of negative bias illumination stress instability in amorphous In—Ga—Zn—O thin film transistors", Appl. Phys. Lett. (Applied Physics Letters), 2010, vol. 97, No. 2, pp. 022108-1-022108-3.

Kang.J et al., "H-related defect complexes in HfO2 : A model for positive fixed charge defects", Appl. Phys. Lett. (Applied Physics Letters), 2004, vol. 84, No. 19, pp. 3894-3896.

Kwon.J et al., "The impact of gate dielectric materials on the light-induced bias instability in Hf—In—Zn—O thin film transistor", Appl. Phys. Lett. (Applied Physics Letters), 2010, vol. 97, No. 18, pp. 183503-1-183503-3.

Cheong.W et al., "Effects of Interfacial Dielectric Layers on the Electrical Performance of Top-Gate In—Ga—Zn—Oxide Thin-Film Transistors", ETRI Journal, Dec. 1, 2009, vol. 31, No. 6, pp. 660-666.

Jeong.J et al., "Origin of threshold voltage instability in indium—gallium—zinc oxide thin film transistors", Appl. Phys. Lett. (Applied Physics Letters), 2008, vol. 93, No. 12, pp. 123508-1-123508-3.

Nomura.K et al., "Stability and high-frequency operation of amorphous In—Ga—Zn—O thin-film transistors with various passivation layers", Thin Solid Films, 2012, vol. 520, pp. 3778-3782, Elsevier.

Jung.J et al., "The charge trapping characteristics of Si3N4 and Al2O3 layers on amorphous-indium—gallium—zinc oxide thin films for memory application", Appl. Phys. Lett. (Applied Physics Letters), Apr. 1, 2012, vol. 100, No. 18, pp. 183503-1-183503-4.

Chong.E et al., "Localization effect of a current-path in amorphous In—Ga—Zn—O thin film transistors with a highly doped buried-layer", Thin Solid Films, 2011, vol. 519, pp. 4347-4350, Elsevier.

Cho.Y et al., "Evaluation of Y2O3 gate insulators for a-IGZO thin film transistors", Thin Solid Films, 2009, vol. 517, pp. 4115-4118, Elsevier.

Sreenivasan.R et al., "Effect of impurities on the fixed charge of nanoscale HfO2 films grown by atomic layer deposition", Appl. Phys. Lett. (Applied Physics Letters), 2006, vol. 89, No. 11, pp. 112903-1-112903-3.

Wang.W et al., "Effect of Al-diffusion-induced positive flatband voltage shift on the electrical characteristics of Al-incorporated high-k metal-oxide-semiconductor field-effective transistor", J. Appl. Phys. (Journal of Applied Physics), 2009, vol. 105, No. 6, pp. 064108-1-064108-6.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

(56) References Cited

OTHER PUBLICATIONS

Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K at al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array.", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S at al., "Challenge to Future Displays: Transparent AM-OLED Driven by PEALD Grown ZnO TFT,", IMID '07 Digest, 2007, pp. 1249-1252.
Godo.H et al., "Temperature Dependence of Characteristics and Electronic Structure For Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H at al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H at al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3—A2O3—BO

(56) References Cited

OTHER PUBLICATIONS

Systems [A; Fe, Ga, or Al; B: Mg, Mn, Fe, Ni, Cu,or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F at al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

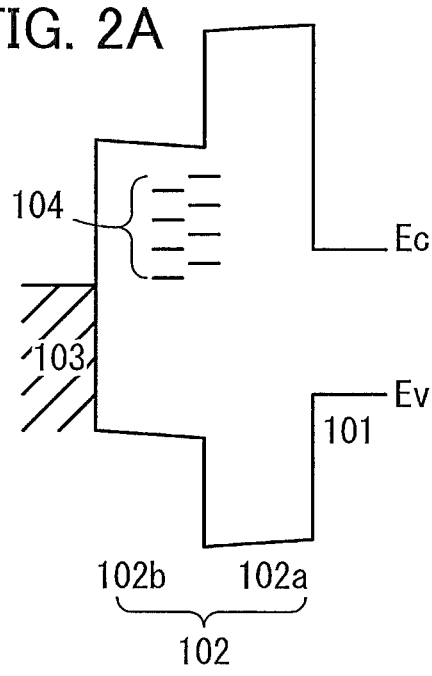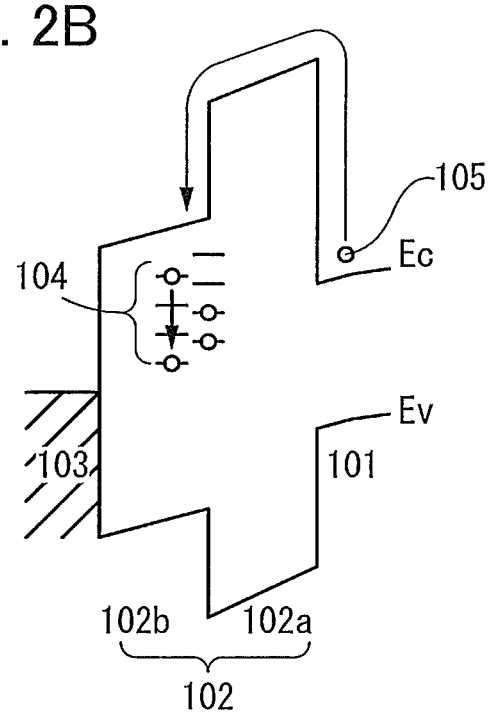

108 before electron trap
109 after electron trap measuring initial characteristics injecting electrons measurement resin sealing and packaging

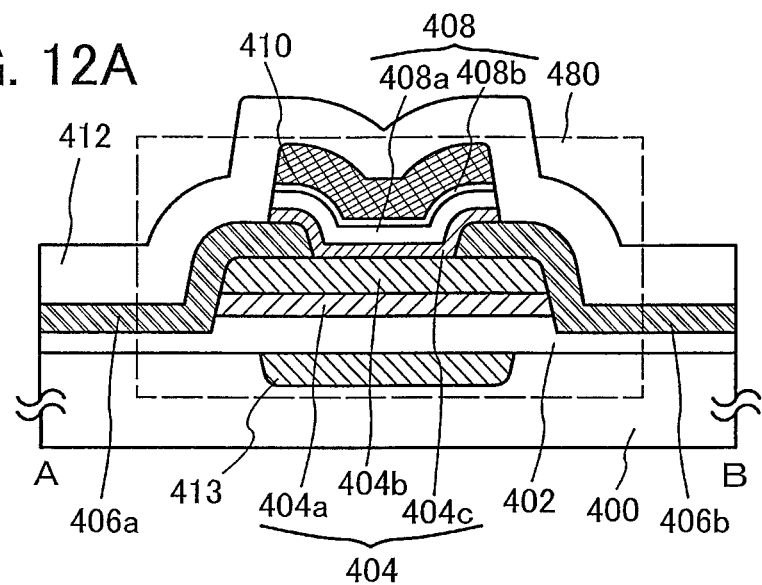
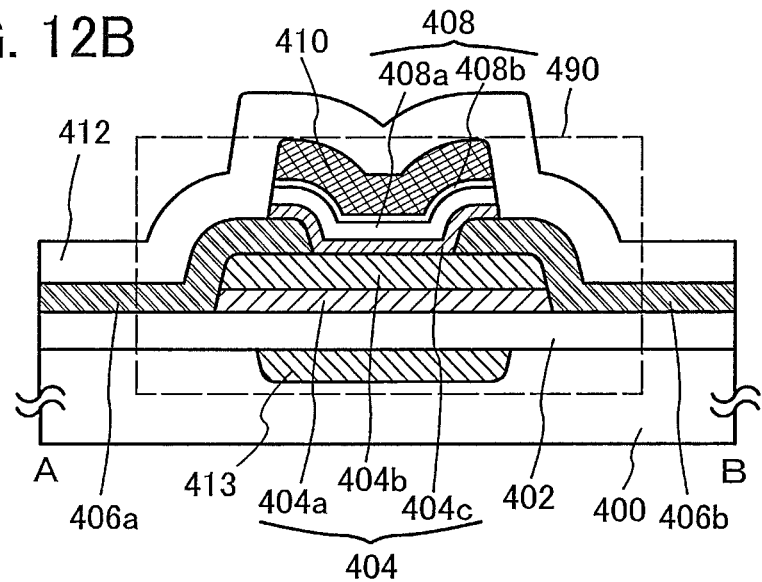

3 nm 3 nm 50 nm 3 nm

METHOD FOR MANUFACTURING SEMICONDUCTOR DEVICE COMPRISING ELECTRON TRAP LAYER

BACKGROUND OF THE INVENTION

1. Field of the Invention

The present invention relates to a semiconductor device.

In this specification, a "semiconductor device" refers to a general device that can function by utilizing semiconductor characteristics; an electro-optical device, a semiconductor circuit, and an electronic device can be included in the category of the semiconductor device. A device including a semiconductor device is regarded as a semiconductor device.

2. Description of the Related Art

A transistor is used in a wide range of electronic devices such as an integrated circuit (IC) or an image display device (display device). As materials of the semiconductor that can be used in the transistor, silicon-based semiconductor materials have been widely known, but oxide semiconductors have been attracting attention as alternative materials.

For example, a transistor including an amorphous oxide semiconductor layer containing indium (In), gallium (Ga), and zinc (Zn) is disclosed in Patent Document 1.

Techniques for improving carrier mobility by employing a stacked structure of an oxide semiconductor layer are disclosed in Patent Documents 2 and 3.

It is known that a transistor including an oxide semiconductor layer has an extremely small leakage current when the transistor is off. For example, a low-power-consumption CPU utilizing such a small leakage current characteristic of a transistor including an oxide semiconductor layer is disclosed (see Patent Document 4).

REFERENCE

Patent Document

[Patent Document 1] Japanese Published Patent Application No. 2006-165528
[Patent Document 2] Japanese Published Patent Application No. 2011-124360
[Patent Document 3] Japanese Published Patent Application No. 2011-138934
[Patent Document 4] Japanese Published Patent Application No. 2012-257187
[Patent Document 5] Japanese Published Patent Application No. 2012-074692

SUMMARY OF THE INVENTION

The transistor size decreases in accordance with an increase in the degree of circuit integration. The miniaturization of a transistor may cause deterioration of electrical characteristics, such as on-state current, off-state current, threshold, and an S value (subthreshold swing), of the transistor (see Patent Document 5). In general, shortening only the channel length increases the on-state current, but at the same time increases the off-state current and the S value. When only the channel width is decreased, the on-state current is decreased.

An object of one embodiment disclosed in this specification is to provide a method for adjusting (correcting) the threshold of a semiconductor device and a semiconductor device suited for the adjusting method. Another object of one embodiment is to provide a semiconductor device having a structure that can prevent deterioration of electrical characteristics, which becomes more significant with the increasing miniaturization. In addition, another object is to provide a highly integrated semiconductor device. Another object is to provide a semiconductor device in which deterioration of on-state current characteristics is reduced. Another object is to provide a semiconductor device with low power consumption. Another object is to provide a semiconductor device with high reliability. Another object is to provide a semiconductor device which can retain data even when power supply is stopped. Another object is to provide a semiconductor device with favorable characteristics. Another object is to provide a novel semiconductor device.

Note that the descriptions of these objects do not disturb the existence of other objects. In one embodiment disclosed in this specification, there is no need to achieve all the above objects. Other objects will be apparent from and can be derived from the description of the specification, the drawings, the claims, and the like.

An embodiment of the present invention is a semiconductor device which includes a first semiconductor, a gate electrode, an electron trap layer between the first semiconductor and the gate electrode, and an electrode (e.g., source or drain electrode) electrically connected to the first semiconductor. In the semiconductor device, the electron trap layer includes crystallized hafnium oxide, and the electron trap layer includes electrons trapped by setting a potential of the gate electrode higher than a potential of the electrode. The electron trap layer may include electron trap states. The crystallized hafnium oxide may be monoclinic. A second semiconductor and a third semiconductor between which the first semiconductor is sandwiched, may be included, in which case the second semiconductor is between the first semiconductor and the gate electrode and the third semiconductor is between the first semiconductor and the electron trap layer. A potential applied to the gate electrode may be lower than a maximum potential that is used in the semiconductor device. The first semiconductor may be an oxide semiconductor.

Another embodiment of the present invention is a method for manufacturing a semiconductor device which includes a first semiconductor, a gate electrode, an electron trap layer between the first semiconductor and the gate electrode, and an electrode electrically connected to the semiconductor layer. The manufacturing method includes the step of forming the electron trap layer by a sputtering method using hafnium oxide as a target. In the sputtering method, when a substrate temperature is Tsub (° C.) and a proportion of oxygen in an atmosphere is P (%), P≥45−0.15×Tsub is satisfied under the following conditions: 0≤P≤100 and Tsub≥−273.

At least one of the following effects described in this paragraph or the effects described in other paragraphs can be achieved: the provision of a method for adjusting the threshold of a semiconductor device, the provision of a semiconductor device having a structure that can prevent deterioration of electrical characteristics, which becomes more significant with the increasing miniaturization, the provision of a highly integrated semiconductor device, the provision of a semiconductor device with low power consumption, the provision of a semiconductor device with high reliability, and the provision of a semiconductor device which can retain data even when power supply is stopped.

BRIEF DESCRIPTION OF THE DRAWINGS

In the accompanying drawings:

FIGS. 2A and 2B illustrate band diagram examples of a semiconductor device of an embodiment;

FIGS. 12A and 12B are cross-sectional views of examples of a transistor;

DETAILED DESCRIPTION OF THE INVENTION

Figure 1A:
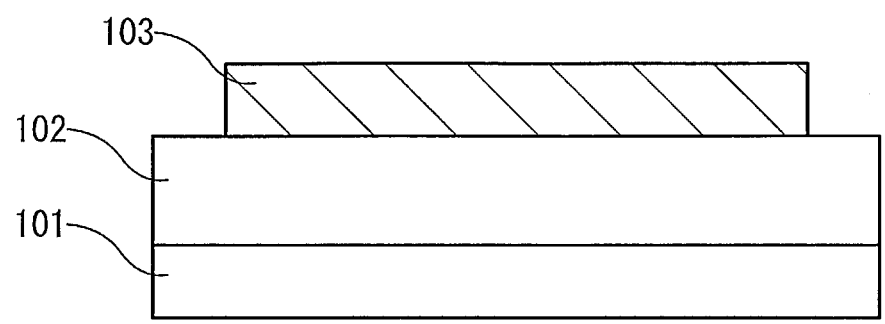
FIGS. 1A to 1C illustrate examples of a semiconductor device of an embodiment.

Embodiments will be described in detail with reference to drawings. The technical idea disclosed in this specification is not limited to the following description and it will be readily appreciated by those skilled in the art that modes and details can be modified in various ways without departing from the spirit and the scope disclosed herein. Therefore, the technical idea disclosed in this specification should not be interpreted as being limited to the description of the embodiments below.

Note that in structures of the present invention described below, the same portions or portions having similar functions are denoted by the same reference numerals in different drawings, and description thereof is not repeated in some cases.

Note that functions of a "source (source electrode)" and a "drain (drain electrode)" of a transistor are sometimes replaced with each other when a transistor of opposite polarity is used or when the direction of current flow is changed in circuit operation, for example. Therefore, the terms "source" and "drain" can be replaced with each other in this specification.

Note that in this specification and the like, ordinal numbers such as "first" and "second" are used in order to avoid confusion among components and do not limit the components numerically.

Embodiment 1

In this embodiment, a structure of a semiconductor device including a semiconductor layer, an electron trap layer, and a gate electrode, the principle of operation of the semiconductor device, and a circuit that uses the semiconductor device will be described. FIG. 1A illustrates a semiconductor device including a semiconductor layer 101, an electron trap layer 102, and a gate electrode 103. The electron trap layer 102 can serve as agate insulating layer.

Figure 1B:
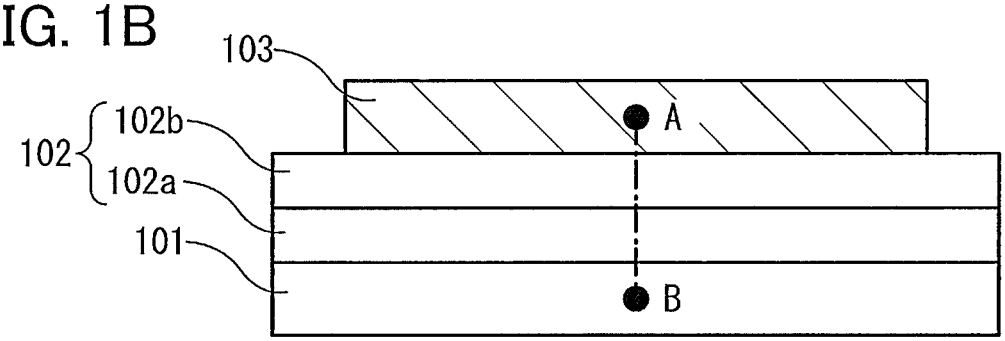
Figure 1C:
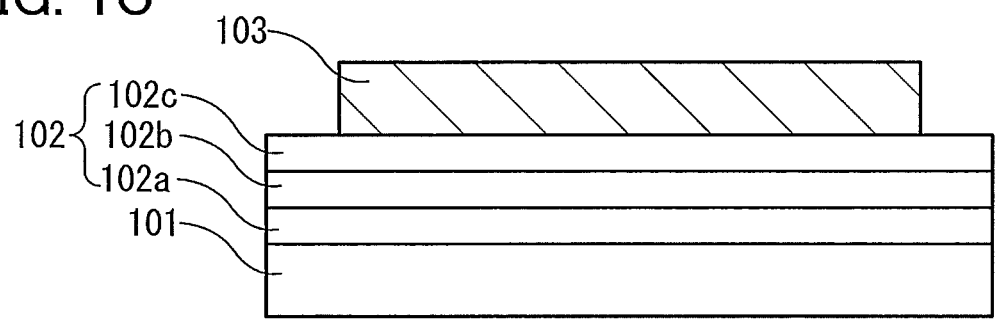

Here, the electron trap layer 102, may be a stacked body that includes a first insulating layer 102a and a second insulating layer 102b that includes crystallized hafnium oxide as illustrated in FIG. 1B, for example. Alternatively, the electron trap layer 102 may be a stacked body that includes the first insulating layer 102a, the second insulating layer 102b that includes crystallized hafnium oxide, and a third insulating layer 102c as illustrated in FIG. 1C, or a stacked body including four or more insulating layers.

As an example of the crystallized hafnium oxide, there is hafnium oxide which has a curve having a peak at $2\theta=25°$ to $30°$ and a full width at half maximum (FWHM) of $2°$ or less in a diffraction spectrum obtained by subtracting a background diffraction spectrum from a diffraction spectrum obtained by X-ray diffraction and which includes at least 1.98 oxygen atoms with respect to one hafnium atom by Rutherford backscattering spectrometry (RBS). By the RBS, elements other than oxygen and hafnium may be detected.

FIG. 2A illustrates a band diagram example of the semiconductor device illustrated in FIG. 1B, from point A to point B. In the drawings, Ec represents a conduction band minimum and Ev represents a valence band maximum. In FIG. 2A, the potential of the gate electrode 103 is the same as the potential of a source electrode or a drain electrode (not illustrated).

In this example, the band gap of the first insulating layer 102a is wider than that of the second insulating layer 102b and the electron affinity of the first insulating layer 102a is lower than that of the second insulating layer 102b; however, the relations of the band gap and the electron affinity are not limited to this example.

Electron trap states 104 exist at the interface between the first insulating layer 102a and the second insulating layer 102b or inside the second insulating layer 102b. FIG. 23 shows the state where the potential of the gate electrode 103 is higher than the potential of the source or drain electrode. The potential of the gate electrode 103 at this process may be higher than the potential of the source or drain electrode by 1 V or more. The potential of the gate electrode 103 at this process may be lower than the highest potential applied to the gate electrode 103 after this process. The potential at this process may be typically less than 4 V.

Electrons 105 that exist in the semiconductor layer 101 move toward the gate electrode 103 having a higher potential. Some of the electrons 105 moving from the semiconductor layer 101 toward the gate electrode 103 are trapped in the electron trap states 104.

There are some processes to enable the electrons 105 to go over the barrier between the semiconductor layer 101 and the electron trap layer 102 and to be trapped in the electron trap states 104. The first is a process by the tunnel effect. The thinner the first insulating layer 102a is, the more prominent the tunnel effect is. Note that electrons trapped by the electron trap states 104 may return to the semiconductor layer 101 by the tunnel effect.

Even when the electron trap layer 102 is relatively thick, the tunnel effect (Fowler-Nordheim tunnel effect) can be obtained by applying an appropriate voltage to the gate electrode 103. In the case of the Fowler-Nordheim tunnel effect, a tunnel current increases with the square of the electric field between the gate electrode 103 and the semiconductor layer 101.

The second is the process that the electrons 105 hop from trap states to trap states in the band gap such as defect states in the electron trap layer 102 to reach the second insulating layer 102b. This is a conduction mechanism called Poole-Frenkel conduction, in which as the absolute temperature is higher and trap states are shallower, the electric conductivity is higher.

The third is the process that the electrons 105 go over the barrier of the electron trap layer 102 by thermal excitation. The distribution of electrons existing in the semiconductor layer 101 follows the Fermi-Dirac distribution; in general, the proportion of electrons having high energy is larger as the temperature is higher. Assuming that the density of electrons having energy 3 eV higher than the Fermi level at 300 K (27° C.) is 1, for example, the density is $6 \times 10^{16}$ at 450 K (177° C.), $1.5 \times 10^{25}$ at 600 K (327° C.), and $1.6 \times 10^{30}$ at 750 K (477° C.).

The movement of the electrons 105 toward the gate electrode 103 by going over the barrier of the electron trap layer 102 occurs by the above three processes or the combination of these processes. In particular, the second and the third processes indicate that current increases exponentially as the temperature is higher.

Also, the Fowler-Nordheim tunnel effect is more likely to occur as the density of electrons in a thin part (a high-energy portion) of the barrier layer of the electron trap layer 102 is higher; thus, a higher temperature is better.

Note that in most cases, current generated by the conduction mechanism is weak in particular when the difference in potential between the gate electrode 103 and the semiconductor layer 101 is small (4 V or lower). However, by taking a long time for the process (e.g., 1 second or more), a necessary number of electrons can be trapped by the electron trap states 104. As a result, the electron trap layer 102 is negatively charged.

In other words, the potential of the gate electrode 103 is kept higher than that of the source or drain electrode at a high temperature (a temperature higher than the operating temperature or the storage temperature of the semiconductor device, or higher than or equal to 125° C. and lower than or equal to 450° C., typically higher than or equal to 150° C. and lower than or equal to 300° C.) for one second or longer, typically 1 minute or longer. As a result, a necessary number of electrons moves from the semiconductor layer 101 toward the gate electrode 103 and some of them are trapped by the electron trap states 104. The temperature of the process for trapping electrons is referred to as process temperature below.

Here, the number of electrons trapped by the electron trap states 104 can be adjusted by the potential of the gate electrode 103. When a certain number of electrons are trapped by the electron trap states 104, due to the electrons, the electric field of the gate electrode 103 is blocked and a channel formed in the semiconductor layer 101 disappears.

The total number of electrons trapped by the electron trap states 104 increases linearly at first, and then, the rate of increase gradually decreases and the total number of electrons converges at a certain value. The convergence value depends on the potential of the gate electrode 103. As the potential is higher, the number of trapped electrons tends to be larger; however, it never exceeds the total number of electron trap states 104.

The electrons trapped by the electron trap states 104 are required not to transfer from the electron trap layer 102 to the other regions. For this, the thickness of the electron trap layer 102 is preferably set at a thickness at which the tunnel effect is not a problem. For example, the physical thickness is preferably more than 1 nm.

If the thickness of the electron trap layer 102 is too large as compared with the channel length of the semiconductor device, the subthreshold value is increased to degrade the off-state characteristics. For this reason, the channel length is more than or equal to four times, typically more than or equal to ten times as large as the equivalent silicon oxide thickness (EOT) of the electron trap layer 102. Note that when a so-called High-K material is used, the EOT is less than the physical thickness.

Typically, the physical thickness of the electron trap layer 102 is more than or equal to 10 nm and less than or equal to 100 nm and the EDT of the electron trap layer 102 is more than or equal to 10 nm and less than or equal to 25 nm. In the structures as illustrated in FIG. 1B or 1C, the thickness of the first insulating layer 102a is more than or equal to 10 nm and less than or equal to 20 nm, and the EOT of the second insulating layer 102b is more than or equal to 1 nm and less than or equal to 25 nm.

To hold electrons trapped by the electron trap states 104 inside the second insulating layer 102b or at the interface with another insulating layer, it is effective that the electron trap layer 102 is formed of three insulating layers as illustrated in FIG. 1C, that the electron affinity of the third insulating layer 102c is smaller than that of the second insulating layer 102b, and that the bandgap of the third insulating layer 102c is larger than that of the second insulating layer 102b.

In this case, if the physical thickness of the third insulating layer 102c is large enough, electrons trapped by the electron trap states 104 can be held even when the second insulating layer 102b has a small thickness. As a material of the third insulating layer 102c, the same material as or a material similar to that of the first insulating layer 102a can be used. Alternatively, a material whose constituent elements are the same as those of the second insulating layer 102b but number of electron trap states is small enough may be used. The number of electron trap states depends on the formation method. The thickness of the third insulating layer 102c is more than or equal to 1 nm and less than or equal to 20 nm.

In the above structure, the first insulating layer 102a, the second insulating layer 102b, and the third insulating layer 102c may each be formed of a plurality of insulating layers. A plurality of insulating layers containing the same constituting elements and formed by different formation methods may be used.

When the first and second insulating layers 102a and 102b are formed using insulating layers formed of hafnium oxide, the first insulating layer 102a may be formed by a chemical vapor deposition method (including a CVD method and an atomic layer deposition (ALB) method) and the second insulating layer 102b may be formed by a sputtering method.

As described later, hafnium oxide deposited by a sputtering method is more easily crystallized and includes more charge trap states 104 than hafnium oxide deposited by a CVD method, and thus has stronger electron trapping characteristics. For this reason, the second insulating layer 102b may be formed by a sputtering method and the third insulating layer 102c may be formed by a CVD method when the second and third insulating layers 102b and 102c are formed of hafnium oxide.

The second method for preventing electrons trapped by the electron trap states 104 from transferring from the electron trap layer 102 to the other regions is to set the operating temperature or the storage temperature of the semiconductor device at a temperature that is lower enough than the process temperature. For example, the process temperature is set at 300° C., and the semiconductor device is stored at 120° C. or lower. The probability that electrons go over a 3 eV-barrier when the temperature is 120° C. is less than a one hundred-thousandth that when the temperature is 300° C. In this way, although electrons easily go over a barrier to be trapped by the electron trap states 104 during the process at 300° C., the electrons are difficult to go over the barrier during storage at 120° C., and are kept trapped by the electron trap states 104 for a long time.

It is also effective that the effective mass of a hole is extremely large or is substantially localized in the semiconductor layer 101. In this case, the injection of holes from the semiconductor layer 101 to the electron trap layer 102 does not occur and consequently a phenomenon in which electrons trapped by the electron trap states 104 bond to holes and disappear does not occur.

Circuit design or material selection may be made so that no voltage at which electrons trapped in the electron trap layer 102 are released is applied. For example, in a material whose effective mass of holes is extremely large or is substantially localized, such as an In—Ga—Zn-based oxide semiconductor, a channel is formed when the potential of the gate electrode 103 is higher than that of the source or drain electrode; however, when the potential of the gate electrode 103 is lower than that of the source or drain electrode, the material shows characteristics similar to an insulator. In this case, the electric field between the gate electrode 103 and the semiconductor layer 101 is extremely small and consequently the Fowler-Nordheim tunnel effect or electron conduction according to the Poole-Frenkel conduction is significantly decreased.

The second insulating layer 102b is formed under conditions that make the second insulating layer 102b include much crystallized hafnium oxide. Accordingly, many electron trap states 104 are formed at the interface between the first insulating layer 102a and the second insulating layer 102b and at the interface between the second insulating layer 102b and the third insulating layer 102c.

By setting the potential of the gate electrode 103 and the temperature at the above-described conditions, electrons from the semiconductor layer 101 are trapped by the electron trap states 104 as described with FIG. 2B, so that the electron trap layer 102 is negatively charged.

The threshold of a semiconductor device is increased by the trap of electrons in the electron trap layer 102. In particular, when the semiconductor layer 101 is formed using a wide band gap material, a source-drain current (cut-off current, Icut) when the potential of the gate electrode 103 is equal to the potential of the source electrode can be significantly decreased.

For example, Icut per micrometer of a channel width of an In—Ga—Zn-based oxide whose band gap is 3.2 eV is 1 zA/μm ($1\times10^{-21}$ A/μm) or less, typically 1 yA/μm ($1\times10^{-24}$ A/μm) or less.

Figure 3A:
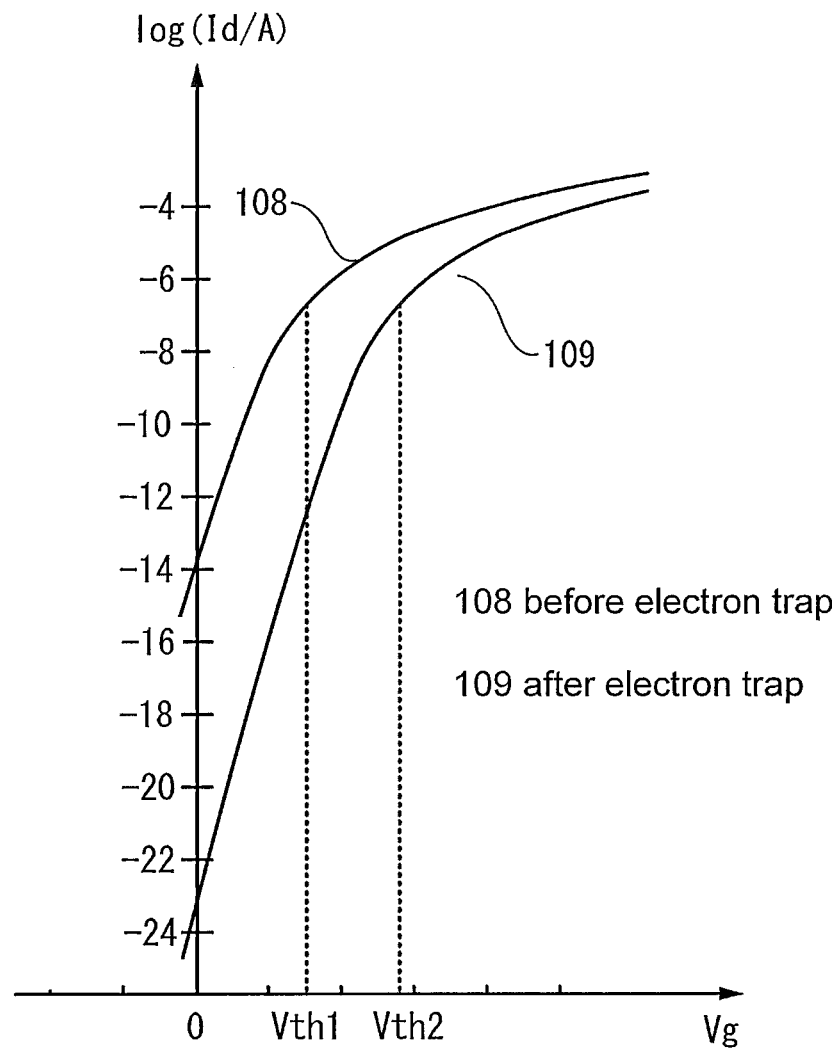
FIG. 3A schematically shows characteristics of a semiconductor device of an embodiment and FIG. 3B illustrates an example of a circuit in which the semiconductor device is used.

FIG. 3A schematically shows dependence of current per micrometer of channel width (Id) between source and drain electrodes on the potential of the gate electrode 103 (Vg) at room temperature, before and after electron trap in the electron trap layer 102. The potential of the source electrode is 0 V and the potential of the drain electrode is +1 V. Although current smaller than 1 fA cannot be measured directly, it can be estimated from a value measured by another method, the subthreshold value, and the like. Note that Example is referred to for the measurement method.

As indicated by a curve 108, the threshold of the semiconductor device is Vth1 at first. After electron trapping, the threshold increases (shifts in the positive direction) to become Vth2. As a result, Icut per micrometer of a channel width becomes 1 aA/μm ($1\times10^{-18}$ A/μm) or less, for example, greater than or equal to 1 zA/μm and less than or equal to 1 yA/μm.

Figure 3B:
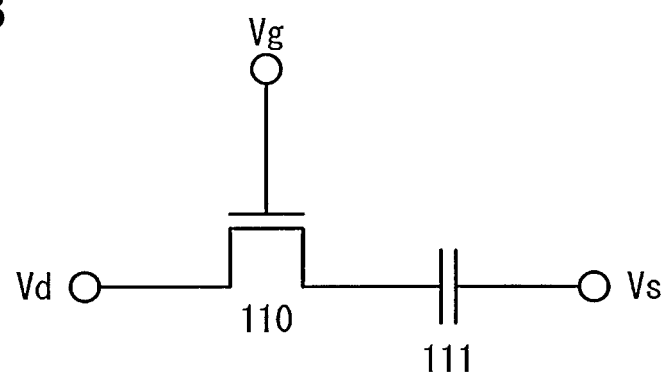

FIG. 3B illustrates a circuit in which charge stored in a capacitor 111 is controlled by a transistor 110. Leakage current between electrodes of the capacitor 111 is ignored here. The capacitance of the capacitor 111 is 1 fF, the potential of the capacitor 111 on the transistor 110 side is +1 V, and the potential of Vd is 0 V.

The curve 108 in FIG. 3A denotes the Id-Vg characteristics of the transistor 110. When the channel width is 0.1 μm, the Icut is approximately 1 fA and the resistivity of the transistor 110 at this time is approximately $1\times10^{15}\Omega$. Accordingly, the time constant of a circuit composed of the transistor 110 and the capacitor 111 is approximately one second. This means that most of the charge stored in the capacitor 111 is lost in approximately one second.

The curve 109 in FIG. 3A denotes the Id-Vg characteristics of the transistor 110. When the channel width is 0.1 μm, the Icut is approximately 1 yA and the resistivity of the transistor 110 at this time is approximately $1\times10^{24}\Omega$. Accordingly; the time constant of the circuit composed of the transistor 110 and the capacitor 111 is approximately $1\times10^9$ seconds (=approximately 31 years). This means that one-third of the charge stored in the capacitor 111 is left after 10 years.

From this, charge can be held for 10 years in a simple circuit composed of a transistor and a capacitor. This can be applied to various kinds of memory devices, such as memory cells illustrated in FIGS. 4A and 4B.

Figure 4A:
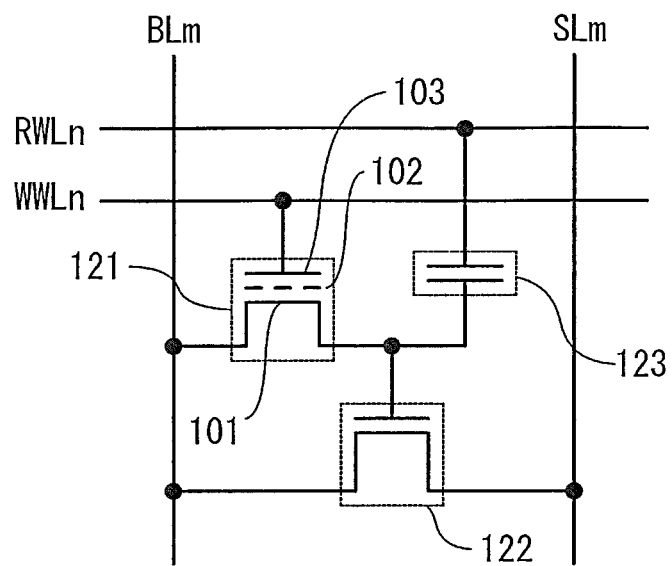
FIGS. 4A and 4B illustrate examples of a memory cell of an embodiment.

The memory cell illustrated in FIG. 4A includes a transistor 121, a transistor 122, and a capacitor 123. The transistor 121 includes the electron trap layer 102 as illustrated in FIG. 1A. After the circuit is formed, the above-described process for increasing the threshold (also referred to as "threshold adjustment process" or "threshold correction process") is performed to lower lent. Note that in the drawing, the transistor with the adjusted threshold that includes electrons in the electron trap layer 102 is represented by a symbol that is different from the symbol for a normal transistor.

Memory cells in FIG. 4A are formed in a matrix. For example, to the memory cell in the n-th row and m-th column, a read word line RWLn, a write word line WWLn, a bit line BLm, and a source line SLm are connected.

The threshold correction can be performed as follows. First, potentials of all read word lines, all source lines, and all bit lines are set at 0 V. Then, a wafer or chip over which the memory cells are formed is set at an appropriate temperature and the potentials of all the write word lines are set at an appropriate value (e.g., +3 V), and these conditions are held for an appropriate period. In this way; the threshold becomes an appropriate value.

Figure 4B:
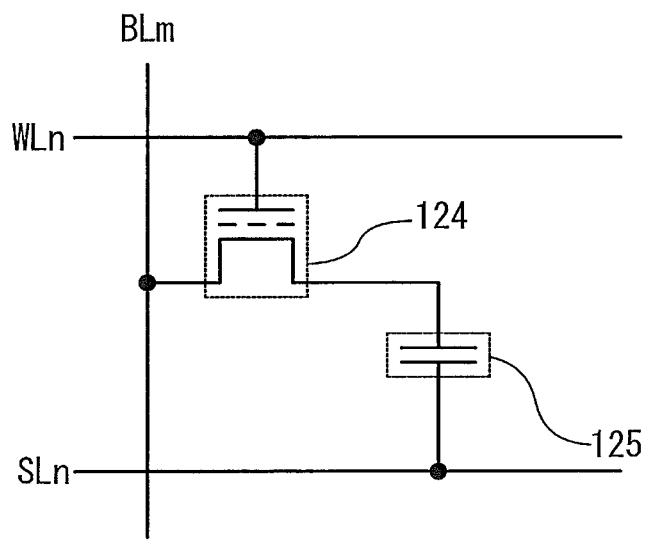

Note that the memory cell may have a structure including a transistor 124 and a capacitor 125 as illustrated in FIG. 4B. For example, to the memory cell in the n-th row and m-th column, a word line WLn, a bit line BLm, and a source line SLn are connected. The method for correcting the threshold can be similar to that in the case of FIG. 4A.

Note that in the threshold adjustment process, even when the temperature is room temperature or in the vicinity of room temperature, by making the potential of the gate electrode 103 high enough, electrons enough to sufficiently increase the threshold can be supplied to the electron trap layer 102 in a short time. By utilizing this feature, the semiconductor device can be used as a memory device. In particular, the semiconductor device can be used as a one-time programmable memory.

Figure 5A:
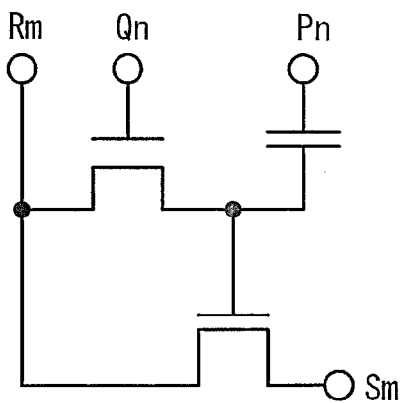
FIGS. 5A to 5C illustrate an example of a manufacturing process of a semiconductor device.

The threshold adjustment process is preferably performed before shipping of the semiconductor device including the memory cells. For example, steps illustrated in FIGS. 5A to 5C can be performed. After memory cells are formed, first, initial characteristics are measured to select a conforming item (see FIG. 5A). Here, items without malfunctions that cannot be recovered due to a break in a wire or the like are regarded as conforming items. At this stage, the threshold has not been adjusted to an appropriate value and thus charge in the capacitor cannot be held for a long time; however, this is not the criteria of selection.

Figure 5B:
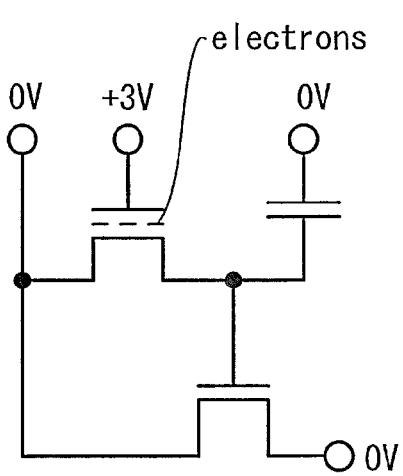

Then, electrons are injected as illustrated in FIG. 5B. An appropriate number of electrons are trapped in the electron trap layer. This operation is performed in the above-described manner. At this stage, the difference between the potential of the gate electrode 103 and the potential of the one with the lower potential of the source electrode and the drain electrode (gate voltage) is more than or equal to 1 V and less than 4V and, in addition, less than or equal to the gate voltage after shipment of this memory cell.

Figure 5C:
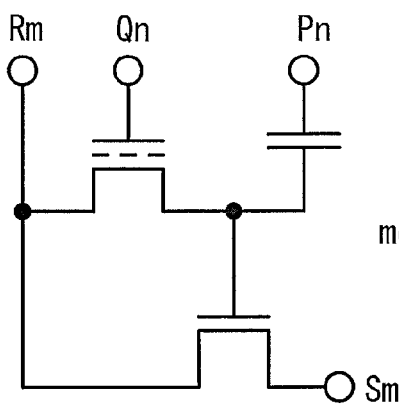

Then, measurement is performed again as illustrated in FIG. 5C. One of the criteria for conforming items is the threshold increased as planned. At this stage, chips with a threshold abnormality are regarded as nonconforming items, and these chips may again be subjected to electron injection. Conforming items are shipped after dicing, wire bonding, resin sealing, and packaging.

The increase in the threshold depends on the density of electrons trapped by the electron trap layer 102. For example, in the semiconductor device illustrated in FIG. 1B, in the case where electrons are trapped only at the interface between the first insulating layer 102a and the second insulating layer 102b, the threshold is increased by Q/C, where Q is the surface density of trapped electrons and C is the dielectric constant of the first insulating layer 102a.

As described above, the potential of the gate electrode 103 determines the value at which the number of trapped electrons converges. Accordingly, the increase in the threshold can be adjusted by the potential of the gate electrode 103.

As an example, a case in which the potential of the gate electrode 103 is set higher than the potentials of the source electrode and the drain electrode by 1.5 V and the temperature is set at higher than or equal to 150° C., and lower than or equal to 250° C., typically 200° C.±20° C. is considered.

Assuming that the threshold of the semiconductor device before electrons are trapped in the electron trap layer 102 (first threshold, Vth1) is +1.1 V, a channel is formed in the semiconductor layer 101 at first and electrons are trapped in the electron trap layer 102. Then, the number of trapped electrons in the electron trap layer 102 increases, and the channel disappears. At this stage, trap of electrons in the electron rap layer 102 stops.

In this case, because the channel disappears when the potential of the gate electrode 103 is higher than the potentials of the source electrode and the drain electrode by 1.5 V, the threshold becomes +1.5 V. It can also be said that the threshold is increased by 0.4 V by electrons trapped in the electron trap layer 102. The threshold that has been changed by electrons trapped in the electron trap layer 102 is referred to as a second threshold (Vth2).

By utilizing these characteristics, the thresholds of a plurality of semiconductor devices which are initially largely different from each other can converge at values within an appropriate range. For example, if three semiconductor devices with the first thresholds of +1.2 V, +1.1 V, and +0.9 V are subjected to the process under above-described conditions, trap of electrons does not make the threshold to become significantly higher than +1.5 V in each semiconductor device; the second threshold of each semiconductor device can become approximately +1.5 V. For example, the variation in threshold (e.g., standard deviation) can be reduced to a quarter of the initial variation by the threshold adjustment process.

Note that after the thresholds of the transistors are changed by the threshold adjustment process, the number of trapped electrons in the electron trap layer 102 (or the surface density of electrons, or the like) is different among the three semiconductor devices.

Any of a variety of materials can be used for the gate electrode 103. For example, a conductive layer of Al, Ti, Cr, Co, Ni, Cu, Y, Zr, Mo, Ru, Ag, Ta, W, or the like can be used. The gate electrode 103 may have a stacked-layer structure of any of the above materials. Alternatively, a conductive layer containing nitrogen may be used as the gate electrode 103. For example, a titanium nitride layer over which a tungsten layer is stacked, a tungsten nitride layer over which a tungsten layer is stacked, a tantalum nitride layer over which a tungsten layer is stacked, or the like can be used as the gate electrode 103.

Note that the work function of the gate electrode 103 that faces the semiconductor layer 101 is one factor determining the threshold of the semiconductor device; in general, as the work function of a material is smaller, the threshold becomes lower. However, as described above, the threshold can be adjusted by adjusting the number of trapped electrons in the electron trap layer 102; accordingly, the range of choices for the material of the gate electrode 103 can be widened.

Any of a variety of materials can be used for the semiconductor layer 101. For example, other than silicon, germanium, and silicon germanium, any of a variety of oxide semiconductors described later can be used.

Any of a variety of materials can be used for the first insulating layer 102a. For example, an insulating layer containing one or more kinds selected from magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide can be used.

The second insulating layer 102b can be formed of crystallized hafnium oxide. The crystallized hafnium oxide can be obtained by a sputtering method using hafnium oxide as a target, for example; however, the formation method is not limited thereto. When the substrate temperature is Tsub (° C.) and the proportion (vol % or mol %) of oxygen in an atmosphere is P (%) in the sputtering method, an example of conditions is as follows: P≥45−0.15×Tsub (0≤P≤100 and Tsub≥−273).

In the case where hafnium oxide is deposited by a sputtering method using hafnium oxide as a target, higher substrate temperature and/or higher oxygen proportion facilitate the crystallization. In the hafnium oxide used as the target, the sum of oxygen atoms and hafnium atoms is 90% or higher, typically 99% or higher of the total atoms of the target, and at least 1.7 oxygen atoms, typically at least 1.98 oxygen atoms exist with respect to one hafnium atom.

In the crystallized hafnium oxide that can be obtained by a sputtering method, the sum of oxygen atoms and hafnium atoms is 90% or higher, typically 99% or higher of the total atoms of the hafnium oxide, and more than or equal to 1.98 and less than or equal to 2.3 oxygen atoms, typically more than or equal to 2.14 and less than or equal to 2.24 oxygen atoms exist with respect to one hafnium atom. The above results are obtained by Rutherford backscattering spectrometry (RBS).

The third insulating layer 102e can be formed using any of a variety of materials. For example, an insulating layer including one or more kinds selected from magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide can be used.

Thus, the semiconductor device in which a necessary number of electrons are trapped in the electron trap layer 102 is the same as a normal MOS semiconductor device. That is, the electron trap layer 102 serves as a gate insulating layer.

Note that the timing of the threshold adjustment process is not limited to that described above and may be any of the following timings before leaving the factory, for example: after formation of a wiring connected to the source electrode or the drain electrode of the semiconductor device, after backplane process (wafer process), after wafer dicing, and after packaging. In either case, it is preferable that the semiconductor device be not exposed to temperatures of 125° C. or higher for 1 hour or more after the threshold adjustment process.

In the above-described example, the threshold of the semiconductor device is adjusted to an appropriate value by trap of electrons in the electron trap layer 102. However, depending on the materials of the electron trap layer 102 and the semiconductor layer 101, holes might be trapped in the electron trap layer 102; in this case, the threshold is lowered and can be adjusted to an appropriate value, according to the similar principle. To trap holes in the electron trap layer 102, the potential of the gate electrode 103 is set lower than the potential of the source or drain electrode by 1 V or more.

Embodiment 2

In this embodiment, a semiconductor device which is one embodiment disclosed in this specification is described with reference to drawings.

Figure 6A:
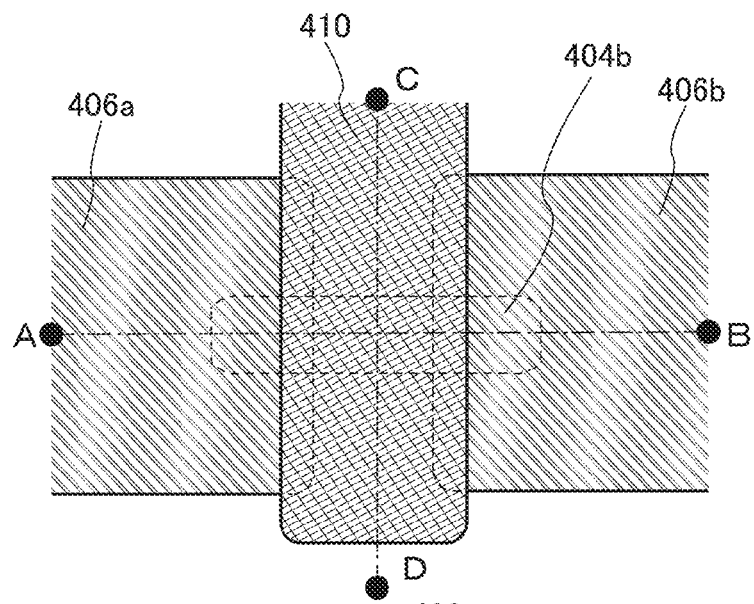
FIGS. 6A to 6C are a top view and cross-sectional views of an example of a transistor.
Figure 6B:
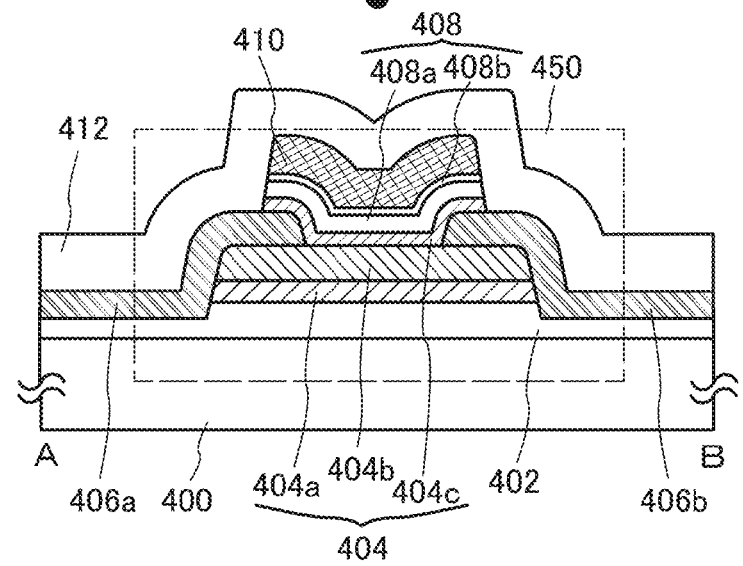
Figure 6C:
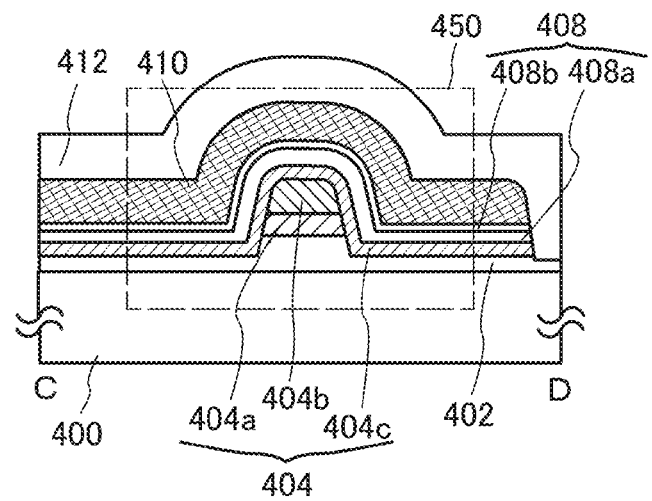

FIGS. 6A to 6C are a top view and cross-sectional views illustrating a transistor of one embodiment disclosed in this specification. FIG. 6A is the top view, FIG. 6B illustrates a cross section taken along the dashed-dotted line A-B in FIG. 6A, and FIG. 6C illustrates a cross section taken along the dashed-dotted line C-D in FIG. 6A. Note that for drawing simplicity; some components are not illustrated in the top view of FIG. 6A. In some cases, the direction of the dashed-dotted line A-B is referred to as a channel length direction, and the direction of the dashed-dotted line C-D is referred to as a channel width direction.

A transistor 450 illustrated in FIGS. 6A to 6C includes a substrate 400; a base insulating layer 402 having a depression portion and a projection portion over the substrate 400; an oxide semiconductor layer 404a and an oxide semiconductor layer 404b over the projection portion of the base insulating layer 402; a source electrode 406a and a drain electrode 406b over the oxide semiconductor layer 404a and the oxide semiconductor layer 404b; an oxide semiconductor layer 404c in contact with the depression portion of the base insulating layer 402, a side surface of the projection portion (depression portion) of the base insulating layer 402, a side surface of the oxide semiconductor layer 404a, a side surface and a top surface of the oxide semiconductor layer 404b, the source electrode 406a, and the drain electrode 406b; a gate insulating layer 408 over the oxide semiconductor layer 404c; a gate electrode 410 provided over and in contact with the gate insulating layer 408 and facing the top surface and the side surface of the oxide semiconductor layer 404b, and an oxide insulating layer 412 over the source electrode 406a, the drain electrode 406b, and the gate electrode 410.

The gate insulating layer 408 functions as the electron trap layer described in Embodiment 1. Here, the gate insulating layer 408 has a stacked structure including a first insulating layer 408a formed by a CVD method and a second insulating layer 408b formed thereover by a sputtering method. However, the gate insulating layer 408 may further include an insulating layer formed thereover by a CVD method (the third insulating layer 102c in Embodiment 1) as illustrated in FIG. 1C.

The oxide semiconductor layer 404a, the oxide semiconductor layer 404b, and the oxide semiconductor layer 404c are collectively referred to as a multilayer semiconductor layer 404.

In the case where a material used as the gate insulating layer 408 has a high relative dielectric constant, the gate insulating layer 408 can be formed thick. For example, in the case of using hafnium oxide with a relative dielectric constant of 16, the gate insulating layer 408 can be formed approximately four times as thick as the gate insulating layer 408 using silicon oxide with a relative dielectric constant of 3.9. The increase in the thickness of the gate insulating layer 408 is preferable in terms of preventing the leakage of trapped electrons. Note that the thickness of the gate insulating layer 408 is more than or equal to 1 nm and less than or equal to 100 nm, typically more than or equal to 5 nm and less than or equal to 20 nm.

Note that the channel length refers to the distance between a source (a source region, source electrode) and a drain (drain region, drain electrode) in a region where a semiconductor layer overlaps with a gate electrode in the top view. That is, the channel length in FIG. 6A is the distance between the source electrode 406a and the drain electrode 406b in the region where the oxide semiconductor layer 404b overlaps with the gate electrode 410. The channel width refers to the width of a source or a drain in a region where a semiconductor layer overlaps with a gate electrode. That is, the channel width in FIG. 6A is the width of the source electrode 406a or the drain electrode 406b in the region where the semiconductor layer 404b overlaps with the gate electrode 410.

When the gate insulating layer 408 functions as an electron trap layer, electrons can be trapped in electron trap states existing inside the layer as described in Embodiment 1. The number of electrons trapped in the electron trap states can be adjusted by the potential of the gate electrode 410.

The gate electrode 410 electrically covers the oxide semiconductor layer 404b, increasing the on-state current. This transistor structure is referred to as a surrounded channel (s-channel) structure. In the s-channel structure, a current flows through an entire region of the oxide semiconductor layer 404b (bulk). Since a current flows through the oxide semiconductor layer 404b, an adverse effect of interface scattering is unlikely to occur, leading to a high on-state current. Note that as the oxide semiconductor layer 404b is thicker, the on-state current can be increased.

In formation of a transistor with a short channel length and a short channel width, when an electrode, a semiconductor layer, or the like is processed at the same time when a resist mask is recessed, the electrode, the semiconductor layer, or the like has a rounded upper end portion (curved surface) in some cases. With this structure, the coverage with the gate insulating layer 408, the gate electrode 410, and the oxide insulating layer 412, which are to be formed over the oxide semiconductor layer 404b, can be improved. In addition, electric field concentration that might occur at end portions of the source electrode 406a and the drain electrode 406b can be reduced, which can suppress deterioration of the transistor.

By miniaturization of the transistor, a high degree of integration and a high density can be achieved. For example, the channel length of the transistor is less than or equal to 100 nm, preferably less than or equal to 40 nm, further preferably less than or equal to 30 nm, and still further preferably less than or equal to 20 nm, and the channel width of the transistor is less than or equal to 100 nm, preferably less than or equal to 40 nm, further preferably less than or equal to 30 nm, and still further preferably less than or equal to 20 nm. Even with such a narrow channel, a transistor of one embodiment disclosed in this specification can increase the on-state current by having the s-channel structure.

The substrate 400 is not limited to a simple supporting substrate, and may be a substrate where another device such as a transistor is formed. In that case, at least one of the gate electrode 410, the source electrode 406a, and the drain electrode 406b of the transistor 450 may be electrically connected to the above device.

The base insulating layer 402 can have a function of supplying oxygen to the multilayer semiconductor layer 404 as well as a function of preventing diffusion of impurities from the substrate 400. In the case where the substrate 400 is provided with another device as described above, the base insulating layer 402 also has a function as an interlayer insulating layer. In that case, since the base insulating layer 402 has an uneven surface, the base insulating layer 402 is preferably subjected to planarization treatment such as chemical mechanical polishing (CMP) treatment so as to have a flat surface.

The multilayer semiconductor layer 404 in the channel formation region of the transistor 450 has a structure in which the oxide semiconductor layer 404a, the oxide semiconductor layer 404b, and the oxide semiconductor layer 404c are stacked in this order from the substrate 400 side. The oxide semiconductor layer 404b is surrounded by the oxide semiconductor layer 404a and the oxide semiconductor layer 404c. As in FIG. 6C, the gate electrode 410 electrically covers the oxide semiconductor layer 404b.

Here, for the oxide semiconductor layer 404b, for example, an oxide semiconductor whose electron affinity (an energy difference between a vacuum level and the conduction band minimum) is higher than those of the oxide semiconductor layer 404a and the oxide semiconductor layer 404c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layer 404a and the oxide semiconductor layer 404c each contain one or more kinds of metal elements forming the oxide semiconductor layer 404b. For example, the oxide semiconductor layer 404a and the oxide semiconductor layer 404c are preferably formed using an oxide semiconductor whose conduction band minimum is closer to a vacuum level than that of the oxide semiconductor layer 404b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the gate electrode 410, a channel is formed in the oxide semiconductor layer 404b where the conduction band minimum is the lowest in the multilayer semiconductor layer 404. In other words, the oxide semiconductor layer 404c is formed between the oxide semiconductor layer 404b and the gate insulating layer 408, whereby a structure in which the channel of the transistor is provided in a region that is not in contact with the gate insulating layer 408 is obtained.

Further, since the oxide semiconductor layer 404a contains one or more metal elements contained in the oxide semiconductor layer 404b, an interface state is unlikely to be formed at the interface between the oxide semiconductor layer 404b and the oxide semiconductor layer 404a, compared with the interface between the oxide semiconductor layer 404b and the base insulating layer 402 on the assumption that the oxide semiconductor layer 404b is in contact with the base insulating layer 402. The interface state sometimes forms a channel, leading to a change in the threshold of the transistor. Thus, with the oxide semiconductor layer 404a, a variation in the electrical characteristics of the transistor, such as threshold, can be reduced. Further, the reliability of the transistor can be improved.

Furthermore, since the oxide semiconductor layer 404c contains one or more metal elements contained in the oxide semiconductor layer 404b, scattering of carriers is unlikely to occur at the interface between the oxide semiconductor layer 404b and the oxide semiconductor layer 404c, compared with the interface between the oxide semiconductor layer 404b and the gate insulating layer 408 on the assumption that the oxide semiconductor layer 404b is in contact with the gate insulating layer 408. Thus, with the oxide semiconductor layer 404c, the field-effect mobility of the transistor can be increased.

For the oxide semiconductor layer 404a and the oxide semiconductor layer 404c, for example, a material containing Al, Ti, Ga, Ge, Y, Zr, Sn, La, Ce, or Hf with a higher atomic ratio than that used for the oxide semiconductor layer 404b can be used. Specifically, an atomic ratio of any of the above metal elements in the oxide semiconductor layer 404a and the oxide semiconductor layer 404c is 1.5 times or more, preferably 2 times or more, further preferably 3 times or more as much as that in the oxide semiconductor layer 404b. Any of the above metal elements is strongly bonded to oxygen and thus has a function of suppressing generation of an oxygen vacancy in the oxide semiconductor layer 404a and the oxide semiconductor layer 404c. That is, an oxygen vacancy is less likely to be generated in the oxide semiconductor layer 404a and the oxide semiconductor layer 404c than in the oxide semiconductor layer 404b.

Note that when each of the oxide semiconductor layer 404a, the oxide semiconductor layer 404b, and the oxide semiconductor layer 404c is an In—M-Zn oxide containing at least indium, zinc, and M (M is a metal such as Al, Ti, Ga, Ge, Y, Zr, Sn, La, Ce, or Hf), and when the oxide semiconductor layer 404a has an atomic ratio of In to M and Zn which is $x_1:y_1:z_1$, the oxide semiconductor layer 404b has an atomic ratio of In to M and Zn which is $x_2:y_2:z_2$, and the oxide semiconductor layer 404c has an atomic ratio of In to M and Zn which is $x_3:y_3:z_3$, $y_1/x_1$ and $y_3/x_3$ is each preferably larger than $y_2/x_2$. $Y_1/x_1$ and $y_3/x_3$ is each 1.5 times or more, preferably 2 times or more, further preferably 3 times or more as large as $y_2/x_2$. At this time, when $y_2$ is greater than or equal to $x_2$ in the oxide semiconductor layer 404b, the transistor can have stable electrical characteristics. However, when $y_2$ is 3 times or more as large as $x_2$, the field-effect mobility of the transistor is reduced; accordingly, $y_2$ is preferably less than 3 times $x_2$.

The proportion of In and M atoms In/(In+M) in the oxide semiconductor layer 404a and the oxide semiconductor layer 404c is preferably less than 0.5 and further preferably less than 0.25. In addition, the proportion of In and M atoms In/(In+M) in the oxide semiconductor layer 404b is preferably 0.25 or more and further preferably 0.34 or more.

The thicknesses of the oxide semiconductor layer 404a and the oxide semiconductor layer 404c are each greater than or equal to 3 nm and less than or equal to 100 nm, preferably greater than or equal to 3 nm and less than or equal to 50 nm. The thickness of the oxide semiconductor layer 404b is greater than or equal to 3 nm and less than or equal to 200 nm, preferably greater than or equal to 3 nm and less than or equal to 100 nm, further preferably greater than or equal to 3 nm and less than or equal to 50 nm. In addition, the oxide semiconductor layer 404b is preferably thicker than the oxide semiconductor layer 404a and the oxide semiconductor layer 404c.

For the oxide semiconductor layer 404a, the oxide semiconductor layer 404b, and the oxide semiconductor layer 404c, an oxide semiconductor containing indium, zinc, and gallium can be used, for example. Note that the oxide semiconductor layer 404b preferably contains indium because carrier mobility can be increased.

Note that stable electrical characteristics can be effectively imparted to a transistor using an oxide semiconductor layer, by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1\times10^{17}/cm^3$, preferably lower than $1\times10^{15}/cm^3$, further preferably lower than $1\times10^{13}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density. In addition, silicon in the oxide semiconductor layer forms an impurity level. The impurity level might become a trap, so that the electrical characteristics of the transistor might deteriorate. Accordingly, in the oxide semiconductor layer 404a, the oxide semiconductor layer 404b, and the oxide semiconductor layer 404c and at interfaces between these layers, the impurity concentration is preferably reduced.

In order to make the oxide semiconductor layer intrinsic or substantially intrinsic, in secondary ion mass spectrometry (SIMS), for example, the concentration of silicon at a certain depth of the oxide semiconductor layer or in a region of the oxide semiconductor layer is preferably lower than $1\times10^{19}$ atoms/$cm^3$, further preferably lower than $5\times10^{18}$ atoms/$cm^3$, still further preferably lower than $1\times10^{18}$ atoms/$cm^3$. Further, the concentration of hydrogen at a certain depth of the oxide semiconductor layer or in a region of the oxide semiconductor layer is preferably lower than or equal to $2\times10^{20}$ atoms/$cm^3$, further preferably lower than or equal to $5\times10^{19}$ atoms/$cm^3$, still further preferably lower than or equal to $1\times10^{19}$ atoms/$cm^3$, yet still further preferably lower than or equal to $5\times10^{18}$ atoms/$cm^3$. Further, the concentration of nitrogen at a certain depth of the oxide semiconductor layer or in a region of the oxide semiconductor layer is preferably lower than $5\times10^{19}$ atoms/$cm^3$, further preferably lower than or equal to $5\times10^{18}$ atoms/$cm^3$, still further preferably lower than or equal to $1\times10^{18}$ atoms/$cm^3$, yet still further preferably lower than or equal to $5\times10^{17}$ atoms/$cm^3$.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer may be lower than $1\times10^{19}$ atoms/$cm^3$, preferably lower than $5\times10^{18}$ atoms/$cm^3$, further preferably lower than $1\times10^{19}$ atoms/$cm^3$. Further, the concentration of carbon at a certain depth of the oxide semiconductor layer or in a region of the oxide semiconductor layer may be lower than $1\times10^{19}$ atoms/$cm^3$, preferably lower than $5\times10^{18}$ atoms/$cm^3$, further preferably lower than $1\times10^{18}$ atoms/$cm^3$, for example.

A transistor in which the above-described highly purified oxide semiconductor layer is used for a channel formation region has an extremely low off-state current. In the case where the voltage between a source and a drain is set at about 0.1 V, 5 V, or 10 V, for example, the off-state current standardized on the channel width of the transistor can be as low as several yoctoamperes per micrometer to several zeptoamperes per micrometer.

Next, the band structure of the multilayer semiconductor layer 404 is described. For analyzing the band structure, a stacked film corresponding to the multilayer semiconductor layer 404 is formed. In the stacked film, In—Ga—Zn oxide with an energy gap of 3.5 eV is used for layers corresponding to the oxide semiconductor layer 404a and the oxide semiconductor layer 404c, and In—Ga—Zn oxide with an energy gap of 3.15 eV is used for a layer corresponding to the oxide semiconductor layer 404b.

The thickness of each of the oxide semiconductor layer 404a, the oxide semiconductor layer 404b, and the oxide semiconductor layer 404c was 10 nm. The energy gap was measured with the use of a spectroscopic ellipsometer (UT-300 manufactured by HORIBA Jobin Yvon). Further, the energy difference between the vacuum level and the valence band maximum was measured using an ultraviolet photoelectron spectroscopy (UPS) device (VersaProbe, ULVAC-PHI. Inc.).

Figure 7A:
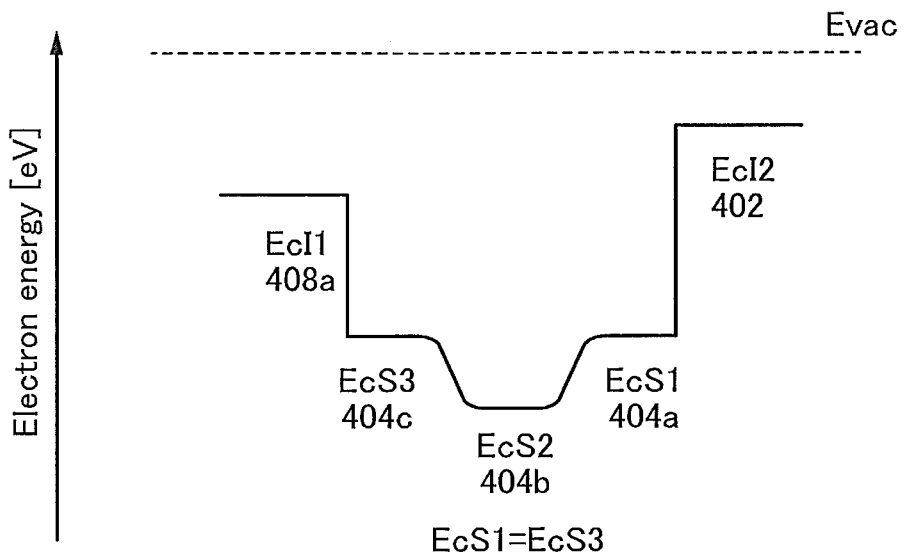
FIGS. 7A and 7B are schematic band diagrams of stacked semiconductor layers.

FIG. 7A is part of a schematic band structure showing an energy difference (electron affinity) between the vacuum level and the conduction band minimum of each layer, which is calculated by subtracting the energy gap from the energy difference between the vacuum level and the valence band maximum. FIG. 7A is a band diagram showing the case where silicon oxide layers are provided in contact with the oxide semiconductor layer 404a and the oxide semiconductor layer 404c. Here, Evac represents energy of the vacuum level, EcI1 represents the conduction band minimum of the gate insulating layer 408 (e.g., hafnium oxide), EcS1 represents the conduction band minimum of the oxide semiconductor layer 404a, EcS2 represents the conduction band minimum of the oxide semiconductor layer 404b, EcS3 represents the conduction band minimum of the oxide semiconductor layer 404c, and EcI2 represents the conduction band minimum of the base insulating layer 402 (e.g., silicon oxide).

As shown in FIG. 7A, the conduction band minimum continuously varies among the oxide semiconductor layer 404a, the oxide semiconductor layer 404b, and the oxide semiconductor layer 404c. This can be understood also from the fact that the constituent elements are common among the oxide semiconductor layer 404a, the oxide semiconductor layer 404b, and the oxide semiconductor layer 404c and oxygen is easily diffused among the oxide semiconductor layers 404a to 404c. Accordingly, the oxide semiconductor layer 404a, the oxide semiconductor layer 404b, and the oxide semiconductor layer 404c have a continuous physical property although they have different compositions in a stack.

The multilayer semiconductor layer 404 in which layers containing the same main components are stacked is formed to have not only a simple stacked-layer structure of the layers but also a continuous energy band (here, in particular, a well structure having a U shape in which the conduction band minimum continuously varies among the layers (U-shape well)). In other words, the stacked-layer structure is formed such that there exist no impurities that form a defect level such as a career trap center or a recombination center at each interface. If impurities exist between the stacked layers in the multilayer semiconductor layer, the continuity of the energy band is lost and carriers at the interface disappear by a trap or recombination.

Note that FIG. 7A shows the case where EcS1 and EcS3 are equal to each other; however, EcS1 and EcS3 may be different from each other. For example, part of the band structure in the case where EcS1 is higher than EcS3 is shown in FIG. 7B.

For example, when EcS1 is equal to EcS3, an In—Ga—Zn oxide whose atomic ratio of In to Ga and Zn is 1:3:2, 1:3:3, 1:3:4, 1:6:4, or 1:9:6 can be used for the oxide semiconductor layer 404a and the oxide semiconductor layer 404c and an In—Ga—Zn oxide whose atomic ratio of In to Ga and Zn is 1:1:1 or 3:1:2 can be used for the oxide semiconductor layer 404b. Further, when EcS1 is higher than EcS3, an In—Ga—Zn oxide whose atomic ratio of In to Ga and Zn is 1:6:4 or 1:9:6 can be used for the oxide semiconductor layer 404a, an In—Ga—Zn oxide whose atomic ratio of In to Ga and Zn is 1:1:1 or 3:1:2 can be used for the oxide semiconductor layer 404b, and an In—Ga—Zn oxide whose atomic ratio of In to Ga and Zn is 1:3:2, 1:3:3, or 1:3:4 can be used for the oxide semiconductor layer 404c, for example.

Figure 7B:
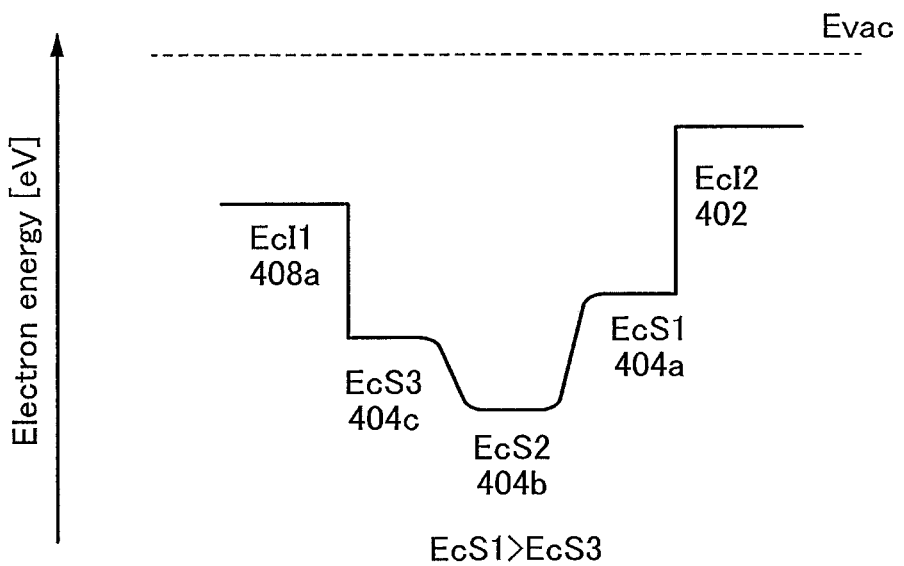

According to FIGS. 7A and 7B, the oxide semiconductor layer 404b of the multilayer semiconductor layer 404 serves as a well, so that a channel is formed in the oxide semiconductor layer 404b in a transistor including the multilayer semiconductor layer 404. Further, a channel formed to have such a structure can also be referred to as a buried channel.

Note that trap states due to impurities or defects might be formed in the vicinity of the interface between the oxide semiconductor layer 404a and an insulating layer having a largely different electron affinity from the oxide semiconductor layer 404a and between the oxide semiconductor layer 404c and an insulating layer having a largely different electron affinity from the oxide semiconductor layer 404c. The oxide semiconductor layer 404b can be distanced away from the trap states owing to existence of the oxide semiconductor layer 404a and the oxide semiconductor layer 404c. However, when the energy differences between EcS2 and EcS1 and between EcS2 and EcS3 are small, an electron in the oxide semiconductor layer 404b might reach the trap states by passing over the energy differences. When the electron is trapped in the trap states, negative fixed charges are generated at the interface with the insulating layers, whereby the threshold of the transistor shifts in the positive direction.

Thus, to reduce a variation in the threshold of the transistor, energy differences between EcS2 and each of EcS1 and EcS3 are necessary. Each of the energy differences is preferably greater than or equal to 0.1 eV, further preferably greater than or equal to 0.15 eV.

The oxide semiconductor layer 404a, the oxide semiconductor layer 404b, and the oxide semiconductor layer 404c preferably include crystal parts. In particular, when a crystal in which c-axes are aligned is used, the transistor can have stable electrical characteristics.

In the case where an In—Ga—Zn oxide is used for the multilayer semiconductor layer 404, it is preferable that the oxide semiconductor layer 404c contain less In than the oxide semiconductor layer 404b so that diffusion of In to the gate insulating layer is prevented.

For the source electrode 406a and the drain electrode 406b, a conductive material that is easily bonded to oxygen is preferably used. For example, Al, Cr, Cu, Ta, Ti, Mo, or W can be used. Among the materials, in particular, it is preferable to use Ti which is easily bonded to oxygen or to use W with a high melting point, which allows subsequent process temperatures to be relatively high. Note that the conductive material that is easily bonded to oxygen includes, in its category, a material to which oxygen is easily diffused.

When the conductive material that is easily bonded to oxygen is in contact with a multilayer semiconductor layer, a phenomenon occurs in which oxygen in the multilayer semiconductor layer is diffused to the conductive material that is easily bonded to oxygen. The phenomenon noticeably occurs when the temperature is high. Since the fabricating process of the transistor involves some heat treatment steps, the above phenomenon causes generation of oxygen vacancies in the vicinity of a region which is in the multilayer semiconductor layer and is in contact with the source electrode or the drain electrode. The oxygen vacancies bond to hydrogen that is slightly contained in the layer, whereby the region is changed to an n-type region. Thus, the n-type region can serve as a source or a drain of the transistor.

In the case of forming a transistor with an extremely short channel length, an n-type region which is formed by the generation of oxygen vacancies might extend in the channel length direction of the transistor, causing a short circuit. In that case, the electrical characteristics of the transistor change; for example, the threshold shifts to cause a state in which on and off states of the transistor cannot be controlled with the gate voltage (conduction state). Accordingly, when a transistor with an extremely short channel length is formed, it is not always preferable that a conductive material that is easily bonded to oxygen be used for a source electrode and a drain electrode.

In such a case, it is preferable to use a conductive material which is less easily bonded to oxygen than the above material is for the source electrode 406a and the drain electrode 406b. As the conductive material which is less easily bonded to oxygen, for example, a material containing tantalum nitride, titanium nitride, or ruthenium or the like can be used. The conductive material which is less easily bonded to oxygen may be formed in contact with the oxide semiconductor layer 404b, and the above-described conductive material that is easily bonded to oxygen may be formed over the conductive material which is less easily bonded to oxygen.

The base insulating layer 402 can be formed using an insulating layer containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide. The gate insulating layer 408 can be formed using an insulating layer containing one or more of hafnium oxide, aluminum oxide, aluminum silicate, and the like. Note that the thickness of the gate insulating layer is more than or equal to 1 nm and less than or equal to 100 nm, preferably more than or equal to 10 nm and less than or equal to 20 nm.

For the gate electrode 410, a conductive layer formed using Al, Ti, Cr, Co, Ni, Cu, Y, Zr, Mo, Ru, Ag, Ta, W, or the like can be used. The gate electrode may be a stack including any of the above materials. Alternatively, a conductive layer containing nitrogen may be used for the gate electrode 410. For example, the gate electrode 410 can be a stack in which a tungsten layer is formed over a titanium nitride layer, a stack in which a tungsten layer is formed over a tungsten nitride layer, or a stack in which a tungsten layer is formed over a tantalum nitride layer.

The oxide insulating layer 412 may be formed over the gate insulating layer 408 and the gate electrode 410. The oxide insulating layer 412 can be formed using an insulating layer containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide. The oxide insulating layer 412 may be a stack including any of the above materials.

Here, the oxide insulating layer 412 preferably contains excess oxygen. An oxide insulating layer containing excess oxygen refers to an oxide insulating layer from which oxygen can be released by heat treatment or the like. The oxide insulating layer containing excess oxygen is preferably a layer in which the amount of released oxygen when converted into oxygen atoms is $1.0 \times 10^{19}$ atoms/cm$^3$ or more in thermal desorption spectroscopy analysis. Note that the temperature of the layer surface in the thermal desorption spectroscopy analysis is preferably higher than or equal to 100° C. and lower than or equal to 700° C., or higher than or equal to 100° C. and lower than or equal to 500° C. Oxygen released from the oxide insulating layer can be diffused to the channel formation region in the multilayer semiconductor layer 404 through the gate insulating layer 408, so that oxygen vacancies formed in the channel formation region can be filled with the oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. A decrease in channel width causes a reduction in on-state current.

In contrast, in the transistor of one embodiment disclosed in this specification, as described above, the oxide semiconductor layer 404c is formed to cover a channel formation region of the oxide semiconductor layer 404b, so that the channel formation region is not in contact with the gate insulating layer. Accordingly, scattering of carriers at the interface between the channel formation region and the gate insulating layer can be reduced and the on-state current of the transistor can be increased.

When the oxide semiconductor layer is formed to be intrinsic or substantially intrinsic, the field-effect mobility might be reduced because of a decrease in the number of carriers contained in the oxide semiconductor layer. However, in the transistor of one embodiment disclosed in this specification, a gate electric field is applied to the oxide semiconductor layer in the side surface direction in addition to the perpendicular direction. That is, the gate electric field is applied to the whole region of the oxide semiconductor layer, whereby current flows in the bulk of the oxide semiconductor layer. Consequently, a change in the electrical characteristics can be suppressed owing to the highly purified intrinsic oxide semiconductor layer and the field-effect mobility of the transistor can be increased.

In the transistor of one embodiment disclosed in this specification, the oxide semiconductor layer 404b is formed over the oxide semiconductor layer 404a, so that an interface state is less likely to be formed. In addition, impurities do not enter the oxide semiconductor layer 404b from above and below because the oxide semiconductor layer 404b is an intermediate layer in a three-layer structure. With the structure in which the oxide semiconductor layer 404b is surrounded by the oxide semiconductor layer 404a and the oxide semiconductor layer 404c (is electrically covered with the gate electrode 410), on-state current of the transistor is increased as described above, and in addition, threshold voltage can be stabilized and an S value can be reduced. Thus, Icut can be reduced and power consumption can be reduced. Further, the threshold of the transistor becomes stable; thus, long-term reliability of the semiconductor device can be improved.

Figure 8A:
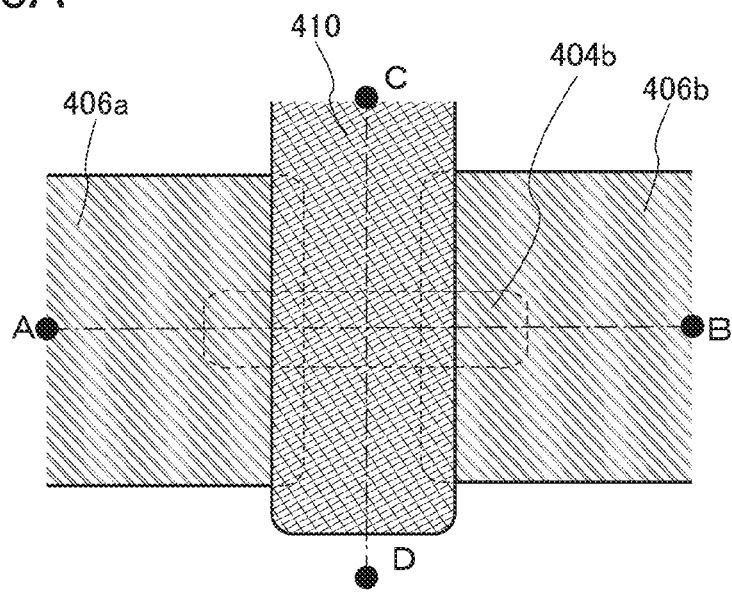
FIGS. 8A to 8C are a top view and cross-sectional views of an example of a transistor.
Figure 8B:
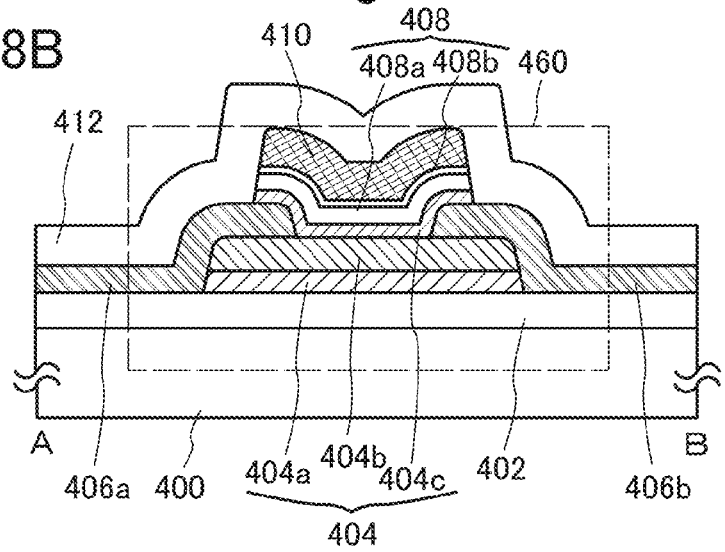
Figure 8C:
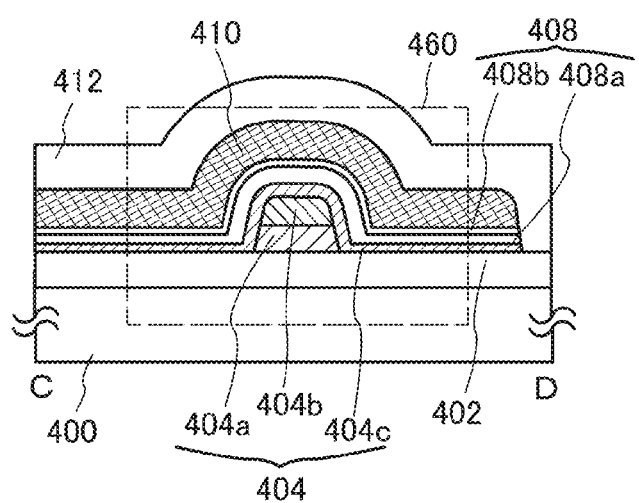

A transistor 460 illustrated in FIGS. 8A to 8C can be used. FIGS. 8A to 8C are a top view and cross-sectional views of the transistor 460. FIG. 8A is the top view. FIG. 8B illustrates a cross section taken along the dashed-dotted line A-B in FIG. 8A. FIG. 8C illustrates a cross section taken along the dashed-dotted line C-D in FIG. 8A. Note that for simplification of the drawing, some components are not illustrated in the top view in FIG. 8A.

In the transistor 460, the base insulating layer 402 is not etched substantially when the source electrode 406a and the drain electrode 406b are formed.

To prevent the base insulating layer 402 from being etched substantially, the etching rate of the base insulating layer 402 is preferably set sufficiently lower than the etching rate of a conductive layer to be processed into the source electrode 406a and the drain electrode 406b.

In this embodiment, although the oxide semiconductor layer 404b is sandwiched between the oxide semiconductor layer 404a and the oxide semiconductor layer 404c, without limited to this structure, one embodiment of the present invention may have a structure in which only the oxide semiconductor layer 404b is provided without the oxide semiconductor layer 404a and the oxide semiconductor layer 404c and is electrically covered with the gate electrode.

This embodiment can be implemented in combination with any of the other embodiments disclosed in this specification as appropriate.

Embodiment 3

In this embodiment, a method for forming the transistor 450, which is described in Embodiment 2 with reference to FIGS. 6A to 6C, is described with reference to FIGS. 9A to 9C and FIGS. 10A to 10C.

Figure 9A:
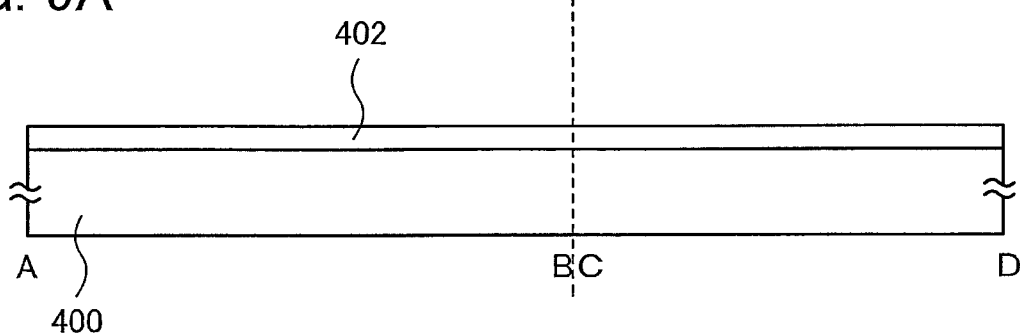
FIGS. 9A to 9C illustrate an example of a method for manufacturing a transistor.

First, the base insulating layer 402 is formed over the substrate 400 (see FIG. 9A).

For the substrate 400, a glass substrate, a ceramic substrate, a quartz substrate, a sapphire substrate, or the like can be used. Alternatively, a single crystal semiconductor substrate or a polycrystalline semiconductor substrate made of silicon, silicon carbide, silicon germanium, or the like, a silicon-on-insulator (SOI) substrate, or the like may be used. Any of these substrates further provided with a semiconductor element thereover may be used.

Oxygen may be added to the base insulating layer 402 by an ion implantation method, an ion doping method, a plasma immersion ion implantation method, or the like. Addition of oxygen enables the base insulating layer 402 to supply oxygen much easily to the multilayer semiconductor layer 404.

Figure 9B:
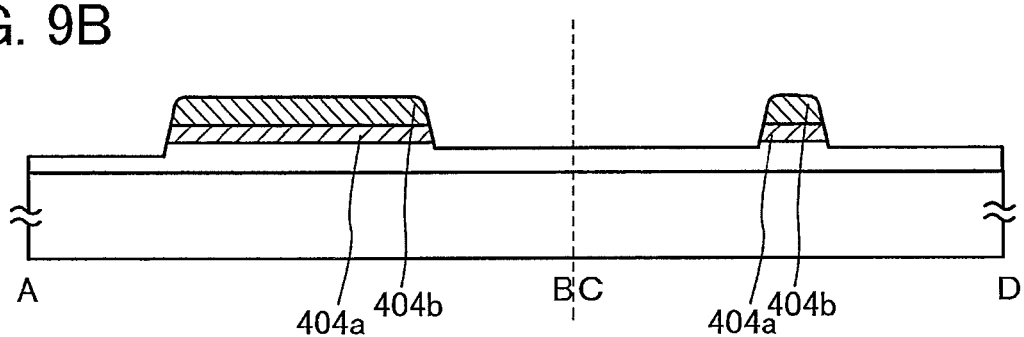

Next, the oxide semiconductor layer 404a and the oxide semiconductor layer 404b are formed over the base insulating layer 402 by a sputtering method; a chemical vapor deposition (CVD) method such as a metal organic chemical vapor deposition (MOCVD) method, an atomic layer deposition (ALD) method, or a plasma-enhanced CVD (PECVD) method; a vacuum evaporation method; or a pulse laser deposition (PLD) method (see FIG. 9B). At this time, as illustrated, the base insulating layer 402 may be slightly over-etched. By over-etching of the base insulating layer 402, the gate electrode 410 to be formed later can cover the oxide semiconductor layer 404c easily.

For processing the oxide semiconductor layer 404a and the oxide semiconductor layer 404b into island shapes, a layer to be a hard mask (e.g., a tungsten layer) and a resist mask are provided over the oxide semiconductor layer 404b, and the layer to be a hard mask is etched to form a hard mask. The resist mask is removed and then the oxide semiconductor layer 404a and the oxide semiconductor layer 404b are etched using the hard mask as a mask. Then, the hard mask is removed. At this step, the hard mask is gradually reduced as the etching progresses; as a result, the edges of the hard mask is rounded to have a curved surface. Accordingly, the edges of the oxide semiconductor layer 404b is rounded to have a curved surface. This structure improves the coverage with the oxide semiconductor layer 404c, the gate insulating layer 408, the gate electrode 410, and the oxide insulating layer 412, which are to be formed over the oxide semiconductor layer 404b, and can prevent shape defects such as disconnection. In addition, electric field concentration which might occur at end portions of the source electrode 406a and the drain electrode 406b can be reduced, which can reduce deterioration of the transistor.

In order to form a continuous junction in stacked layers including the oxide semiconductor layers 404a and 404b, or stacked layers also including the oxide semiconductor layer 404c to be formed in a later step, the layers need to be formed successively without exposure to the air with the use of a multi-chamber deposition apparatus (e.g., a sputtering apparatus) including a load lock chamber. It is preferable that each chamber of the sputtering apparatus be able to be evacuated to a high vacuum (to about $5 \times 10^{-7}$ Pa to $1 \times 10^{-4}$ Pa) by an adsorption vacuum pump such as a cryopump and that the chamber be able to heat a substrate to 100° C. or higher, preferably 500° C. or higher so that water and the like acting as impurities for the oxide semiconductor can be removed as much as possible. Alternatively, a combination of a turbo molecular pump and a cold trap is preferably used to prevent back-flow of a gas containing a carbon component, moisture, or the like from an exhaust system into the chamber.

Not only high vacuum evacuation in a chamber but also increasing the purity of a sputtering gas is necessary to obtain a high-purity intrinsic oxide semiconductor. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor layer can be prevented as much as possible.

The materials described in Embodiment 2 can be used for the oxide semiconductor layer 404a, the oxide semiconductor layer 404b, and the oxide semiconductor layer 404c that is to be formed in a later step. For example, an In—Ga—Zn oxide whose atomic ratio of In to Ga and Zn is 1:3:4 or 1:3:2 can be used for the oxide semiconductor layer 404a, an In—Ga—Zn oxide whose atomic ratio of In to Ga and Zn is 1:1:1 can be used for the oxide semiconductor layer 404b, and an In—Ga—Zn oxide whose atomic ratio of In to Ga and Zn is 1:3:4 or 1:3:2 can be used for the oxide semiconductor layer 404c.

An oxide that can be used for each of the oxide semiconductor layers 404a, 404b, and 404c preferably contains at least indium (In) or zinc (Zn). Both In and Zn are preferably contained. Furthermore, in order to reduce variations in electrical characteristics of the transistors including the oxide, the oxide preferably contains a stabilizer in addition to In and Zn.

As a stabilizer, gallium (Ga), tin (Sn), hafnium (Hf), aluminum (Al), zirconium (Zr), and the like are used. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, In—Zn oxide, Sn—Zn oxide, Al—Zn oxide, Zn—Mg oxide, Sn—Mg oxide, In—Mg oxide, In—Ga oxide, In—Ga—Zn oxide, In—Al—Zn oxide, In—Sn—Zn oxide, Sn—Ga—Zn oxide, Al—Ga—Zn oxide, Sn—Al—Zn oxide, In—Hf—Zn oxide, In—La—Zn oxide, In—Ce—Zn oxide, In—Pr—Zn oxide, In—Nd—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, In—Lu—Zn oxide, In—Sn—Ga—Zn oxide, In—Hf—Ga—Zn oxide, In—Al—Ga—Zn oxide, In—Sn—Al—Zn oxide, In—Sn—Hf—Zn oxide, or In—Hf—Al—Zn oxide.

For example, "In—Ga—Zn oxide" means an oxide containing In, Ga, and Zn as its main components. The In—Ga—Zn oxide may contain another metal element in addition to In, Ga, and Zn. Note that in this specification, a layer containing the In—Ga—Zn oxide is also referred to as an IGZO layer.

A material represented by $InMO_3(ZnO)_m$ (m>0 is satisfied, and m is not an integer) may be used. Note that M represents one or more metal elements selected from Ga, Fe, Mn, or Co. A material represented by $In_2SnO_5(ZnO)_n$ (n>0, n is an integer) may be used.

Note that as described in Embodiment 2 in detail, materials are selected so that the oxide semiconductor layers 404a and 404c each have an electron affinity lower than that of the oxide semiconductor layer 404b.

Note that the oxide semiconductor layer is preferably formed by a sputtering method. As a sputtering method, an RF sputtering method, a DC sputtering method, an AC sputtering method, or the like can be used. In particular, a DC sputtering method is preferably used because dust generated in the film formation can be reduced and the thickness can be uniform.

When In—Ga—Zn oxide is used for the oxide semiconductor layers 404a, 404b, and 404c, a material whose atomic ratio of In to Ga and Zn is any of 1:1:1, 2:2:1, 3:1:2, 1:3:2, 1:3:4, 1:4:3, 1:5:4, 1:6:6, 2:1:3 1:6:4, 1:9:6, 1:1:4, and 1:1:2 is used so that the oxide semiconductor layers 404a and 404c each have an electron affinity lower than that of the oxide semiconductor layer 404b.

Note that the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The indium content in the oxide semiconductor layer 404b is preferably higher than those in the oxide semiconductor layers 404a and 404c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Thus, with use of an oxide having a high indium content for the oxide semiconductor layer 404b, a transistor having high mobility can be achieved.

Here, a structure of an oxide semiconductor layer will be described.

In this specification, a term "parallel" indicates that the angle formed between two straight lines is greater than or equal to −10° and less than or equal to 100, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

An oxide semiconductor layer is classified roughly into a non-single-crystal oxide semiconductor layer and a single crystal oxide semiconductor layer. The non-single-crystal oxide semiconductor layer includes any of a c-axis aligned crystalline oxide semiconductor (CAAC-OS) layer, a polycrystalline oxide semiconductor layer, a microcrystalline oxide semiconductor layer, an amorphous oxide semiconductor layer, and the like.

First of all, a CAAC-OS layer is described.

The CAAC-OS layer is an oxide semiconductor layer including a plurality of crystal parts. Most of the crystal parts each fit inside a cube whose one side is less than 100 nm. Thus, the CAAC-OS layer may include a crystal part that fits inside a cube whose one side is less than 10 nm, less than 5 nm, or less than 3 nm.

In a transmission electron microscope (TEM) image of the CAAC-OS layer, a boundary between crystal parts, that is, a grain boundary is not clearly observed. Thus, in the CAAC-OS layer, a reduction in electron mobility due to the grain boundary is unlikely to occur.

In the TEM image of the CAAC-OS layer observed in a direction substantially parallel to a sample surface (cross-sectional TEM image), metal atoms are arranged in a layered manner in the crystal parts. Each metal atom layer has a morphology reflecting a surface over which the CAAC-OS layer is formed (hereinafter, a surface over which the CAAC-OS layer is formed is referred to as a formation surface) or a top surface of the CAAC-OS layer, and is arranged in parallel to the formation surface or the top surface of the CAAC-OS layer.

In the TEM image of the CAAC-OS layer observed in a direction substantially perpendicular to the sample surface (plan TEM image), metal atoms are arranged in a triangular or hexagonal configuration in the crystal parts. However, there is no regularity in arrangement of metal atoms between different crystal parts.

From the cross-sectional TEM image and the plan TEM image, orientation characteristics are found in the crystal parts in the CAAC-OS layer.

A CAAC-OS layer is subjected to structural analysis with an X-ray diffraction (XRD) apparatus. For example, when the CAAC-OS layer including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS layer have c-axis alignment, and that the c-axes are aligned in a direction substantially perpendicular to the formation surface or the top surface of the CAAC-OS layer.

When the CAAC-OS layer is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Analysis (ϕ scan) is performed under conditions where the sample is rotated around a normal vector of the sample surface as an axis (ϕ axis) with 2θ fixed at around 56°. When the sample is a single-crystal oxide semiconductor layer of InGaZnO$_4$, six peaks appear. The six peaks are derived from crystal planes equivalent to the (110) plane. In contrast, when the sample is the CAAC-OS layer, a peak is not clearly observed.

The above results mean that in the CAAC-OS layer having c-axis alignment, the directions of a-axes and b-axes are different between crystal parts, but the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal is oriented in a direction parallel to a normal vector of a formation surface or a normal vector of a top surface. Thus, for example, when the shape of the CAAC-OS layer is changed by etching or the like, the c-axis might not be necessarily parallel to a normal vector of a formation surface or a normal vector of a top surface of the CAAC-OS layer.

Furthermore, the degree of crystallinity in the CAAC-OS layer is not necessarily uniform. For example, if crystal growth leading to the CAAC-OS layer occurs from the vicinity of the top surface of the layer, the degree of the crystallinity in the vicinity of the top surface may be higher than that in the vicinity of the formation surface. Moreover, when an impurity is added to the CAAC-OS layer, the crystallinity in a region to which the impurity is added is changed, and the degree of crystallinity in the CAAC-OS layer varies depending on regions.

Note that when the CAAC-OS layer with an InGaZnO$_4$ crystal is analyzed by an out-of-plane method, a peak of 2θ may be observed at around 36°, in addition to the peak of 2θ at around 31°. The peak of 2θ at around 36° indicates that a crystal having no c-axis alignment is included in part of the CAAC-OS layer. It is preferable that a peak of 2θ appears at around 31° and a peak of 2θ does not appear at around 36°.

The CAAC-OS layer is an oxide semiconductor layer having low impurity concentration. The impurity is an element other than the main components of the oxide semiconductor layer, such as hydrogen, carbon, silicon, or a transition metal element. In particular, an element that has higher bonding strength to oxygen than a metal element included in the oxide semiconductor layer, such as silicon, disturbs the atomic arrangement of the oxide semiconductor layer by depriving the oxide semiconductor layer of oxygen and causes a decrease in crystallinity. A heavy metal such as iron or nickel, argon, carbon dioxide, or the like has a large atomic radius (molecular radius), and thus disturbs the atomic arrangement of the oxide semiconductor layer and causes a decrease in crystallinity if contained in the oxide semiconductor layer. Note that the impurity contained in the oxide semiconductor layer might serve as a carrier trap center or a carrier generation source.

The CAAC-OS layer is an oxide semiconductor layer having a low density of defect states. Oxygen vacancies in the oxide semiconductor layer may serve as carrier trap centers or carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor layer has few carrier generation sources, and thus can have a low carrier density. Thus, a transistor including the oxide semiconductor layer rarely has negative threshold (is rarely normally on). The highly purified intrinsic or substantially highly purified intrinsic oxide semiconductor layer has few carrier trap centers. Accordingly, the transistor including the oxide semiconductor layer has little variation in electrical characteristics and high reliability. Electric electron trapped by the carrier trap centers in the oxide semiconductor layer takes a long time to be released, and thus may behave like fixed electric charge. Accordingly, the transistor which includes the oxide semiconductor layer having high impurity concentration and a high density of defect states can have unstable electrical characteristics.

In a transistor using the CAAC-OS layer, change in electrical characteristics due to irradiation with visible light or ultraviolet light is small.

Next, a microcrystalline oxide semiconductor layer will be described.

In a TEM image, crystal parts cannot be found clearly in the microcrystalline oxide semiconductor layer in some cases. In most cases, the size of a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor layer including nanocrystal is referred to as an nc-OS (nanocrystalline oxide semiconductor) layer. In a TEM image of the nc-OS layer, for example, a crystal grain boundary cannot clearly found in some cases.

In the nc-OS layer, a microscopic region (for example, a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS layer. Thus, the orientation of the whole layer is not observed. Accordingly, the nc-OS layer sometimes cannot be distinguished from an amorphous oxide semiconductor layer depending on an analysis method. For example, when the nc-OS layer is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS layer obtained by using an electron beam having a probe diameter (e.g., greater than or equal to 50 nm) larger than the diameter of a crystal part. Meanwhile, spots are shown in a nanobeam electron diffraction pattern of the nc-OS layer obtained by using an electron beam having a probe diameter (e.g., greater than or equal to 1 nm and smaller than or equal to 30 nm) close to, or smaller than or equal to a diameter of a crystal part. In a nanobeam electron diffraction pattern of the nc-OS layer, regions with high luminance in a circular (ring) pattern may be shown, and a plurality of spots may be shown in the ring-like region.

The nc-OS layer is an oxide semiconductor layer that has high regularity as compared with an amorphous oxide semiconductor layer. For this reason, the nc-OS layer has a lower density of defect states than an amorphous oxide semiconductor layer. However, there is no regularity of crystal orientation between different crystal parts in the nc-OS layer; hence, the nc-OS layer has a higher density of defect states than the CAAC-OS layer.

Note that an oxide semiconductor layer may be a stacked layer including two or more layers of an amorphous oxide semiconductor layer, a microcrystalline oxide semiconductor layer, and a CAAC-OS layer, for example.

For example, the CAAC-OS layer can be deposited by a sputtering method using a polycrystalline oxide semiconductor sputtering target. When ions collide with the sputtering target, a crystal region included in the sputtering target is sometimes separated from the target along an a-b plane; in other words, a sputtered particle having a plane parallel to an a-b plane (flat-plate-like sputtered particle or pellet-like sputtered particle) flakes off from the sputtering target. The sputtered particle is electrically charged and thus reaches the substrate while maintaining its crystal state, without being aggregation in plasma, forming a CAAC-OS layer.

First heat treatment may be performed after the oxide semiconductor layer 404b is formed. The first heat treatment may be performed at a temperature higher than or equal to 250° C. and lower than or equal to 650° C., typically higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor layer 404b can be improved, and in addition, impurities such as hydrogen and water can be removed from the base insulating layer 402 and the oxide semiconductor layer 404a. Note that the first heat treatment may be performed before etching for formation of the oxide semiconductor layer 404b.

A first conductive layer to be the source electrode 406a and the drain electrode 406b is formed over the oxide semiconductor layers 404a and 404b. For the first conductive layer, Al, Cr, Cu, Ta, Ti, Mo, W, or an alloy material containing any of these as a main component can be used. For example, a 100-nm-thick titanium layer is formed by a sputtering method or the like. Alternatively, a tungsten layer may be formed by a CVD method.

Figure 9C:
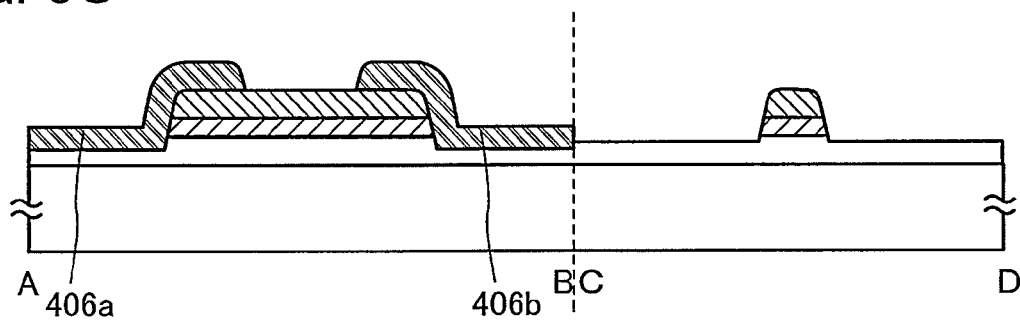

Then, the first conductive layer is etched so as to be divided over the oxide semiconductor layer 404b, so that the source electrode 406a and the drain electrode 406b are formed (see FIG. 9C).

Next, the oxide semiconductor layer 403c is formed over the oxide semiconductor layer 404b, the source electrode 406a, and the drain electrode 406b.

Note that second heat treatment may be performed after the oxide semiconductor layer 403c is formed. The second heat treatment can be performed under conditions similar to those of the first heat treatment. The second heat treatment can remove impurities such as hydrogen and water from the oxide semiconductor layer 403c. In addition, impurities such as hydrogen and water can be further removed from the oxide semiconductor layer 404a and 404b.

Figure 10A:
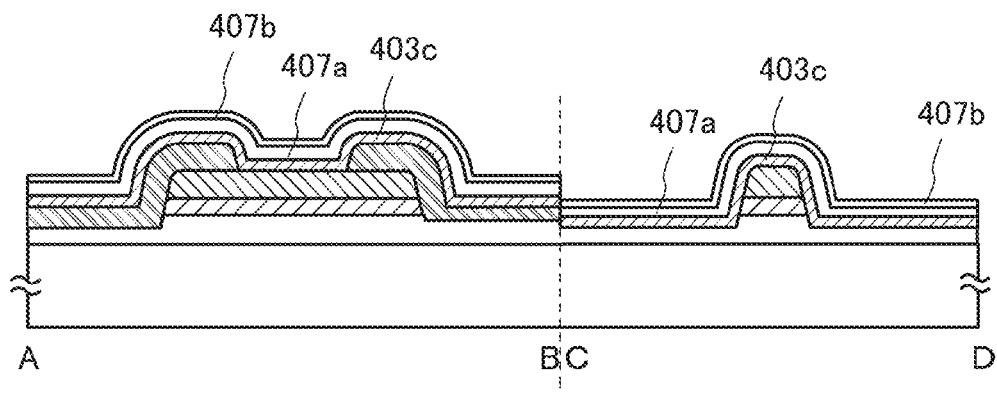
FIGS. 10A to 10C illustrate an example of a method for manufacturing a transistor.

Next, an insulating layer 407a and an insulating layer 407b are formed over the oxide semiconductor layer 403c (see FIG. 10A). For example, the insulating layer 407a is formed by a CVD method, and the insulating layer 407b is formed by a sputtering method. However, the formation methods are not limited to this combination and may be selected from a sputtering method, a chemical vapor deposition (CVD) method such as a metal organic chemical vapor deposition (MOCVD) method, an atomic layer deposition (ALD) method, or a plasma-enhanced CVD (PECVD) method, a vacuum evaporation method, a pulse laser deposition (PLD) method, and the like.

Figure 10B:
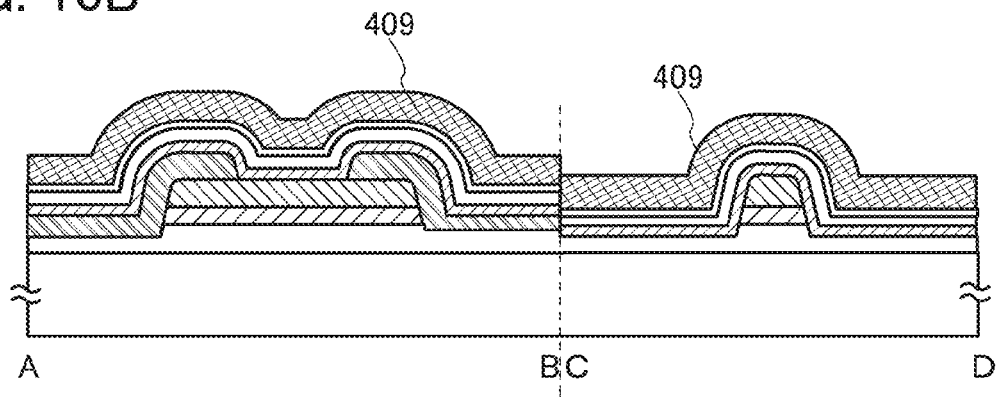

Then, a second conductive layer 409 to be the gate electrode 410 is formed over the insulating layer 407b (see FIG. 10B). For the second conductive layer 409, Al, Ti, Cr, Co, Ni, Cu, Y, Zr, Mo, Ru, Ag, Ta, W, or an alloy material containing any of these as its main component can be used. The second conductive layer 409 can be formed by a sputtering method, a CVD method, or the like. A stack including a conductive layer containing any of the above materials and a conductive layer containing nitrogen, or a conductive layer containing nitrogen may be used for the second conductive layer 409.

Figure 10C:
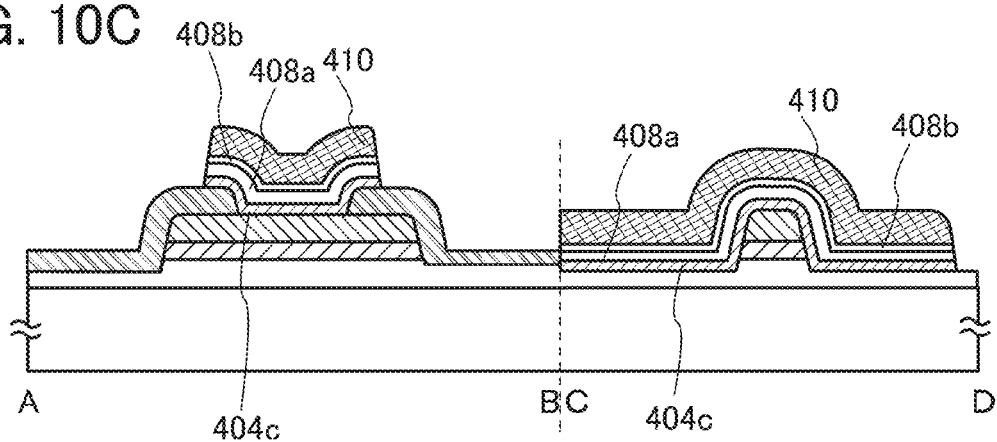

Next, the second conductive layer 409 is selectively etched using a resist mask to form the gate electrode 410 (see FIG. 10C). Note that as shown in FIG. 6C, the oxide semiconductor layer 404b is surrounded by the gate electrode 410.

Then, the insulating layer 407a and the insulating layer 407b are selectively etched using the resist mask or the gate electrode 410 as a mask to form the first insulating layer 408a and the second insulating layer 408b (these are collectively referred to as the gate insulating layer 408).

Then, the oxide semiconductor layer 403c is etched using the resist mask or the gate electrode 410 as a mask to form the oxide semiconductor layer 404c.

The upper edge of the oxide semiconductor layer 404c is aligned with the bottom edge of the gate insulating layer 408. The upper edge of the gate insulating layer 408 is aligned with the bottom edge of the gate electrode 410. Although the gate insulating layer 408 and the oxide semiconductor layer 404c are formed using the gate electrode 410 as a mask, the gate insulating layer 408 and the oxide semiconductor layer 404c may be formed before the second conductive layer 409 is formed.

Next, the oxide insulating layer 412 is formed over the source electrode 406a, the drain electrode 406b, and the gate electrode 410 (see FIGS. 6B and 6C). A material and a method for the oxide insulating layer 412 can be similar to those for the base insulating layer 402. The oxide insulating layer 412 may be using an aluminum oxide, a magnesium oxide, a silicon oxide, a silicon oxynitride, a silicon nitride oxide, a silicon nitride, a gallium oxide, a germanium oxide, an yttrium oxide, a zirconium oxide, a lanthanum oxide, a neodymium oxide, a hafnium oxide, a tantalum oxide, or any of the above oxides containing nitrogen. The oxide insulating layer 412 can be formed by a sputtering method, a chemical vapor deposition (CVD) method such as a metal organic chemical vapor deposition (MOCVD) method, an atomic layer deposition (ALD) method, or a plasma-enhanced CVD (PECVD) method, a vacuum evaporation method, or a pulse laser deposition (PLD) method. The oxide insulating layer 412 preferably contains excessive oxygen so as to be able to supply oxygen to the multilayer semiconductor layer 404.

Next, third heat treatment may be performed. The third heat treatment can be performed under conditions similar to those of the first heat treatment. By the third heat treatment, excess oxygen is easily released from the base insulating layer 402, the gate insulating layer 408, and the oxide insulating layer 412, so that oxygen vacancies in the multilayer layer 404 can be reduced.

Next, fourth heat treatment is performed. In the fourth heat treatment, the potential of the gate electrode 410 is kept higher than that of the source or drain electrode at a high temperature higher than or equal to 125° C. and lower than or equal to 450° C., preferably higher than or equal to 150° C. and lower than or equal to 300° C. for one second or longer, typically 1 minute or longer. As a result, a necessary number of electrons moves from the multilayer semiconductor layer 404 toward the gate electrode 410 and some of them are trapped by the electron trap states existing inside the gate insulating layer 408. By controlling the number of trapped electrons, the increase of threshold can be controlled.

Through the above process, the transistor 450 illustrated in FIGS. 6A to 6C can be fabricated.

This embodiment can be implemented in combination with any of the other embodiments disclosed in this specification as appropriate.

Embodiment 4

In this embodiment, a planar transistor will be described.

Figure 11A:
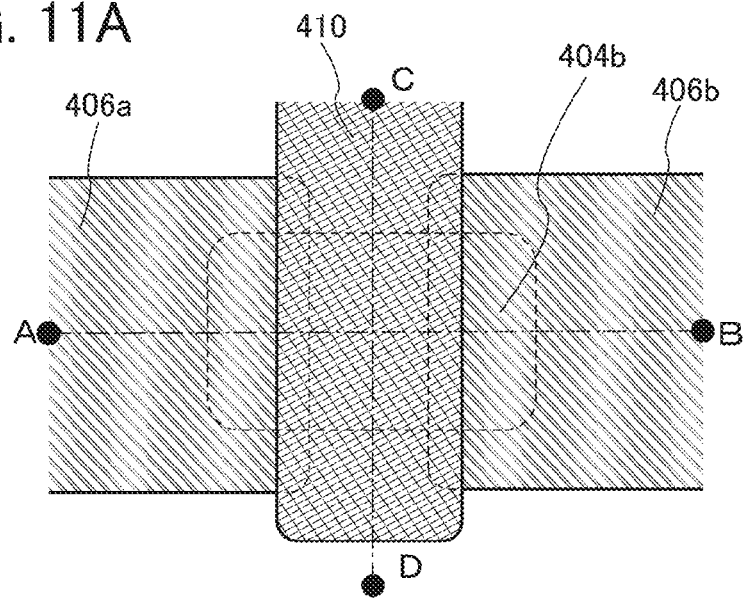
FIGS. 11A to 11C are a top view and cross-sectional views of an example of a transistor.
Figure 11B:
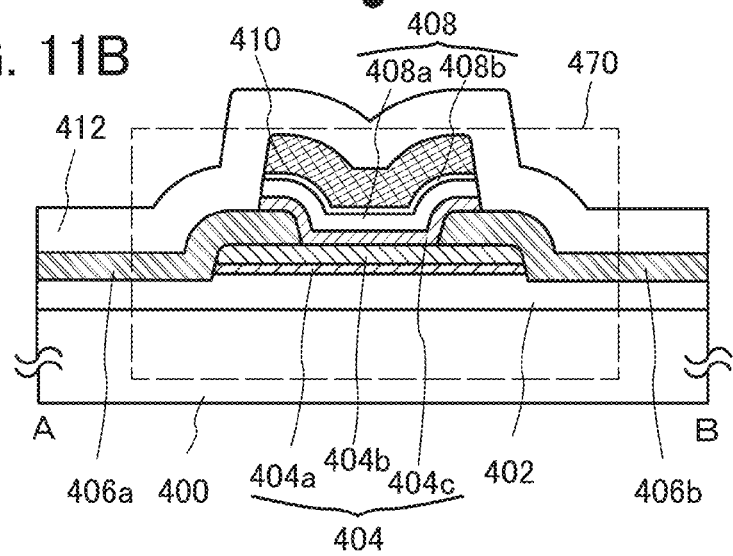
Figure 11C:
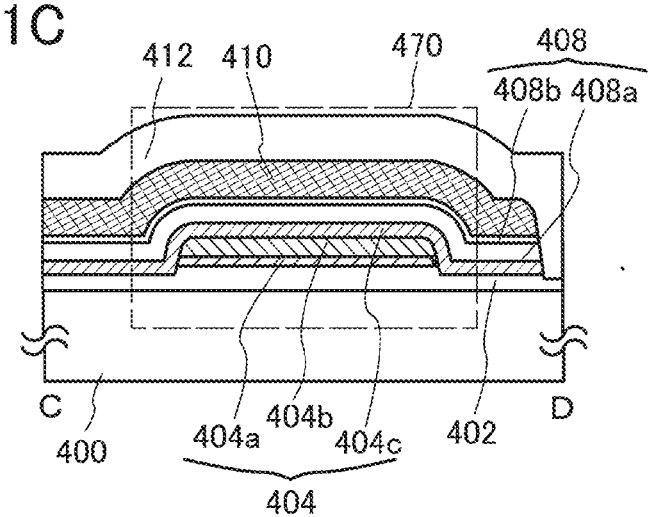

FIGS. 11A to 11C are a top view and cross-sectional views illustrating a transistor of one embodiment disclosed in this specification. FIG. 11A is the top view, FIG. 11B illustrates a cross section taken along the dashed-dotted line A-B in FIG. 11A, and FIG. 11C illustrates a cross section taken along the dashed-dotted line C-D in FIG. 11A. Note that for drawing simplicity, some components are not illustrated in the top view of FIG. 11A. In some cases, the direction of the dashed-dotted line A-B is referred to as a channel length direction, and the direction of the dashed-dotted line C-D is referred to as a channel width direction.

A transistor 470 illustrated in FIGS. 11A to 11C includes a base insulating layer 402 over a substrate 400, an oxide semiconductor layer 404a and an oxide semiconductor layer 404b over the base insulating layer 402, a source electrode 406a and a drain electrode 406b over the oxide semiconductor layer 404a and the oxide semiconductor layer 404b, an oxide semiconductor layer 404c that is in contact with the base insulating layer 402, the oxide semiconductor layer 404a, the oxide semiconductor layer 404b, the source electrode 406a, and the drain electrode 406b, a gate insulating layer 408 over the oxide semiconductor layer 404c, a gate electrode 410 over the gate insulating layer 408, and an oxide insulating layer 412 over the source electrode 406a, the drain electrode 406b, and the gate electrode 410. The gate insulating layer 408 functions as the electron trap layer described in Embodiment 1. The oxide semiconductor layer 404a, the oxide semiconductor layer 404b, and the oxide semiconductor layer 404c are collectively referred to as a multilayer semiconductor layer 404.

The transistor 470 of this embodiment is different from the transistor 450 of Embodiment 2 in having a channel length and a channel width that are more than or equal to twice, typically more than or equal to ten times the thickness of the multilayer semiconductor layer 404.

Note that the channel length refers to the distance between a source (a source region, source electrode) and a drain (drain region, drain electrode) in a region where a semiconductor layer overlaps with a gate electrode in the top view. That is, the channel length in FIG. 11A is the distance between the source electrode 406a and the drain electrode 406b in the region where the oxide semiconductor layer 404b overlaps with the gate electrode 410. The channel width refers to the width of a source or a drain in a region where a semiconductor layer overlaps with a gate electrode. That is, the channel length in FIG. 11A is the width of the source electrode 406a or the drain electrode 406b in the region where the semiconductor layer 404b overlaps with the gate electrode 410.

In this embodiment, although the oxide semiconductor layer 404b is sandwiched between the oxide semiconductor layer 404a and the oxide semiconductor layer 404c, without limited to this structure, one embodiment of the present invention may have a structure in which only the oxide semiconductor layer 404b is provided without the oxide semiconductor layer 404a and the oxide semiconductor layer 404c. Alternatively, one embodiment of the present invention may have a structure in which any one or two of the oxide semiconductor layer 404a, the oxide semiconductor layer 404b, and the oxide semiconductor layer 404c is/are provided.

This embodiment can be implemented in combination with any of the other embodiments disclosed in this specification as appropriate.

Embodiment 5

In this embodiment, a transistor of another structure will be described.

A transistor 480 whose cross section is illustrated in FIG. 12A is the same as the transistor 450 illustrated in FIG. 6B except for including a second gate electrode (back gate electrode) 413. A transistor 490 whose cross section is illustrated in FIG. 12B is the same as the transistor 460 illustrated in FIGS. 8A to 8C except for including the second gate electrode 413. A back gate electrode can also be provided in the transistor 470 illustrated in FIGS. 11A to 11C.

Embodiment 6

The semiconductor device of one embodiment disclosed in this specification can be used for display devices, personal computers, image reproducing devices provided with recording media (typically, devices that reproduce the content of recording media such as digital versatile discs (DVDs) and have displays for displaying the reproduced images), or the like. Other examples of electronic devices that can be equipped with the semiconductor device of one embodiment disclosed in this specification are mobile phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 13A to 13F illustrate specific examples of these electronic devices.

Figure 13A:
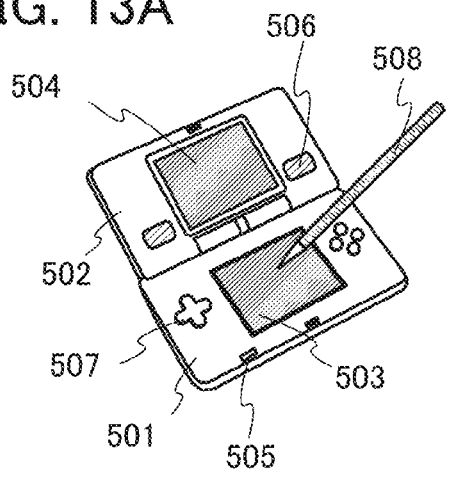
FIGS. 13A to 13F illustrate examples of an electronic device.

FIG. 13A illustrates a portable game machine including a housing 501, a housing 502, a display portion 503, a display portion 504, a microphone 505, a speaker 506, an operation key 507, a stylus 508, and the like. Although the portable game machine in FIG. 13A has the two display portions 503 and 504, the number of display portions included in a portable game machine is not limited to this.

Figure 13B:
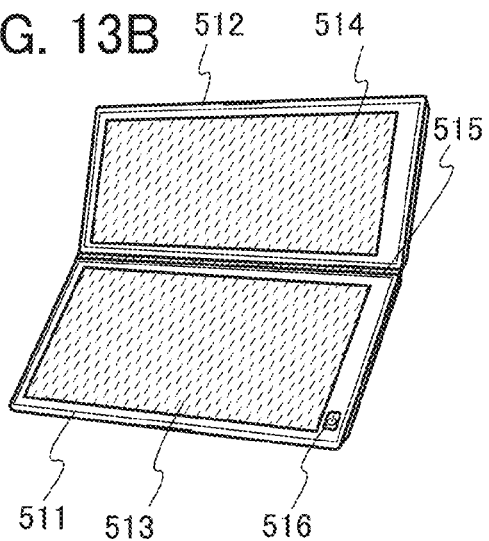

FIG. 13B illustrates a portable data terminal including a first housing 511, a second housing 512, a first display portion 513, a second display portion 514, a joint 515, an operation key 516, and the like. The first display portion 513 is provided in the first housing 511, and the second display portion 514 is provided in the second housing 512. The first housing 511 and the second housing 512 are connected to each other with the joint 515, and the angle between the first housing 511 and the second housing 512 can be changed with the joint 515. An image on the first display portion 513 may be switched depending on the angle between the first housing 511 and the second housing 512 at the joint 515. A display device with a position input function may be used as at least one of the first display portion 513 and the second display portion 514. Note that the position input function can be added by providing a touch panel in a display device. Alternatively, the position input function can be added by provision of a photoelectric conversion element called a photosensor in a pixel area of a display device.

Figure 13C:
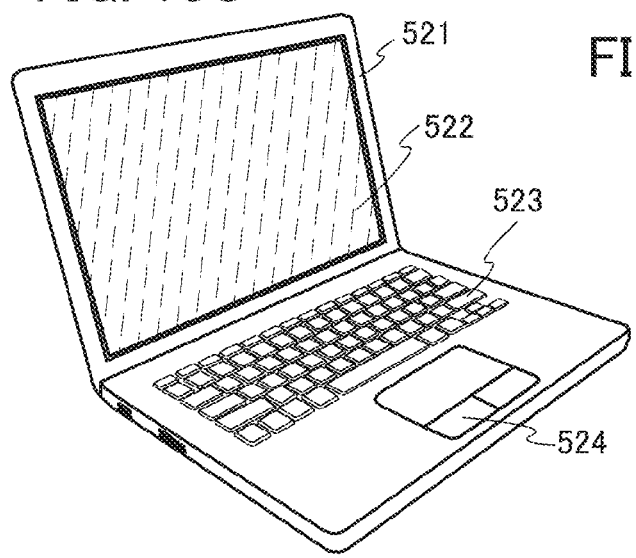

FIG. 13C illustrates a laptop personal computer, which includes a housing 521, a display portion 522, a keyboard 523, a pointing device 524, and the like.

Figure 13D:
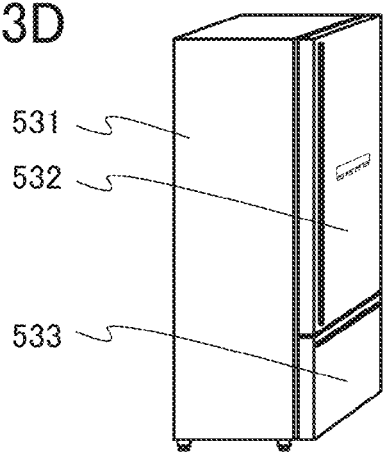

FIG. 13D illustrates the electric refrigerator-freezer including a housing 531, a door for a refrigerator 532, a door for a freezer 533, and the like.

Figure 13E:
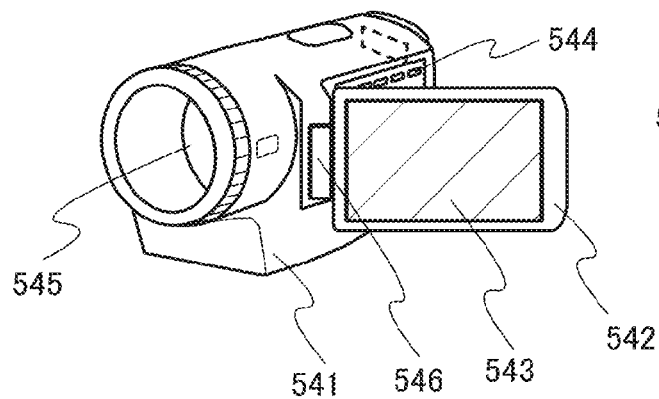

FIG. 13E illustrates a video camera, which includes a first housing 541, a second housing 542, a display portion 543, operation keys 544, a lens 545, a joint 546, and the like. The operation keys 544 and the lens 545 are provided for the first housing 541, and the display portion 543 is provided for the second housing 542. The first housing 541 and the second housing 542 are connected to each other with the joint 546, and the angle between the first housing 541 and the second housing 542 can be changed with the joint 546. Images displayed on the display portion 543 may be switched in accordance with the angle at the joint 546 between the first housing 541 and the second housing 542.

Figure 13F:
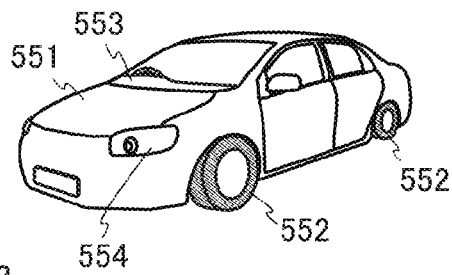

FIG. 13F illustrates a passenger car including a car body 551, wheels 552, a dashboard 553, lights 554, and the like.

This embodiment can be implemented in combination with any of the other embodiments disclosed in this specification as appropriate.

Example 1

In this example, transistors having the same structure as the transistor 470 illustrated in FIGS. 11A to 11C were formed as samples of this example, and electrical characteristics were evaluated.

Figure 14A:
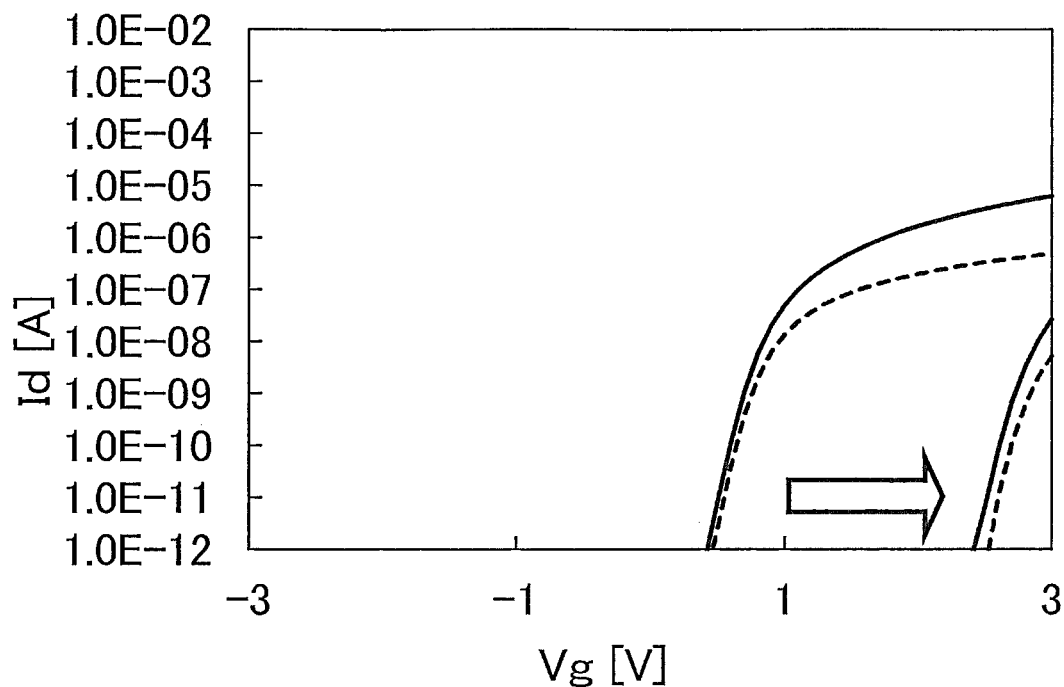
FIGS. 14A and 14B show measurement results of electrical characteristics of transistors formed in Example.
Figure 14B:
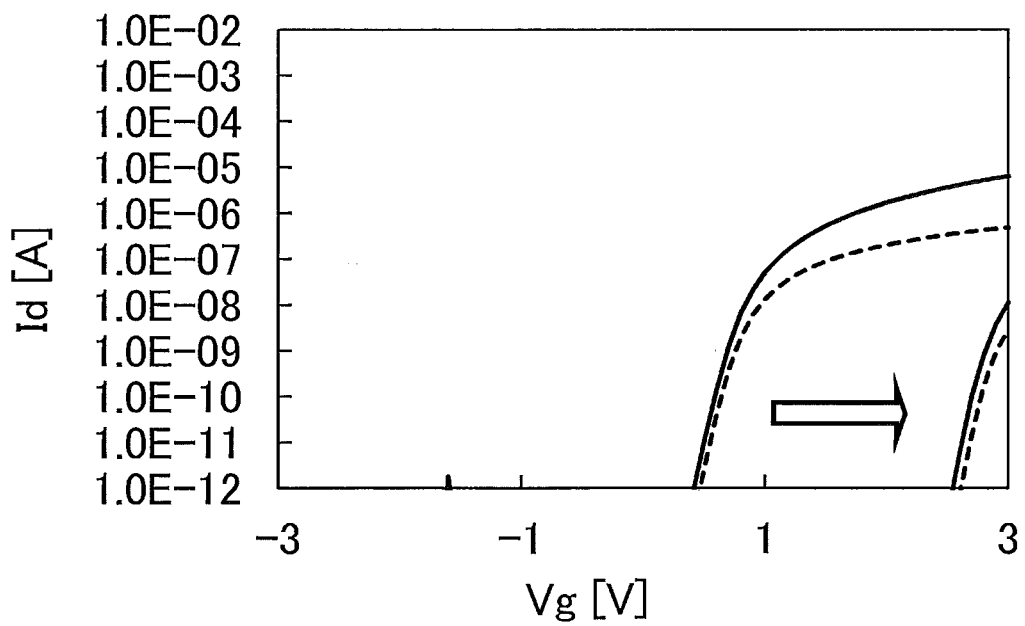

First, a stress test for the transistors is described. In the stress test, the source potential and the drain potential of the transistors are set at 0 V, the gate potential is set at +3.3 V, and the transistors are kept at 150° C. for 1 hour. The measurement results of two samples fabricated under certain conditions before and after the stress test are shown in FIGS. 14A and 14B. FIGS. 14A and 14B show the measurement results at a drain potential (Vd: [V]) of 0.1 V and 3.0 V (the source potential is 0 V in both cases), where the horizontal axis represents a gate potential (Vg: [V]) and the vertical axis represents a drain current (Id: [A]). Note that the solid line in the graphs indicates the measurement results at a drain potential Vd of 3.0 V, and the dotted line indicates the measurement results at a drain potential Vd of 0.1 V.

In the graphs, electrical characteristics before and after the stress test are shown. The electrical characteristics shown on the line segment side of the arrow represent electrical characteristics before the stress test, and the electrical characteristics shown on the triangle vertex side of the arrow represent electrical characteristics after the stress test. As shown in FIGS. 14A and 14B, a variation in threshold ΔVth is 1.76 V in FIG. 14A and 1.78 V in FIG. 14B. The results show that the threshold shifts in the positive direction by the stress test.

Note that it was confirmed that the threshold shifts shown in FIGS. 14A and 14B were able to be maintained through a high-temperature hold test. The hold test was performed on the transistors that had been subjected to the stress test under either first conditions or second conditions. The first conditions were as follows: the gate potential was set at 0 V, and the transistor was kept at 150° C. for 1 hour. The second conditions were as follows: the gate potential was set at −3.3 V, and the transistor was kept at 150° C. for 1 hour.

Figure 15A:
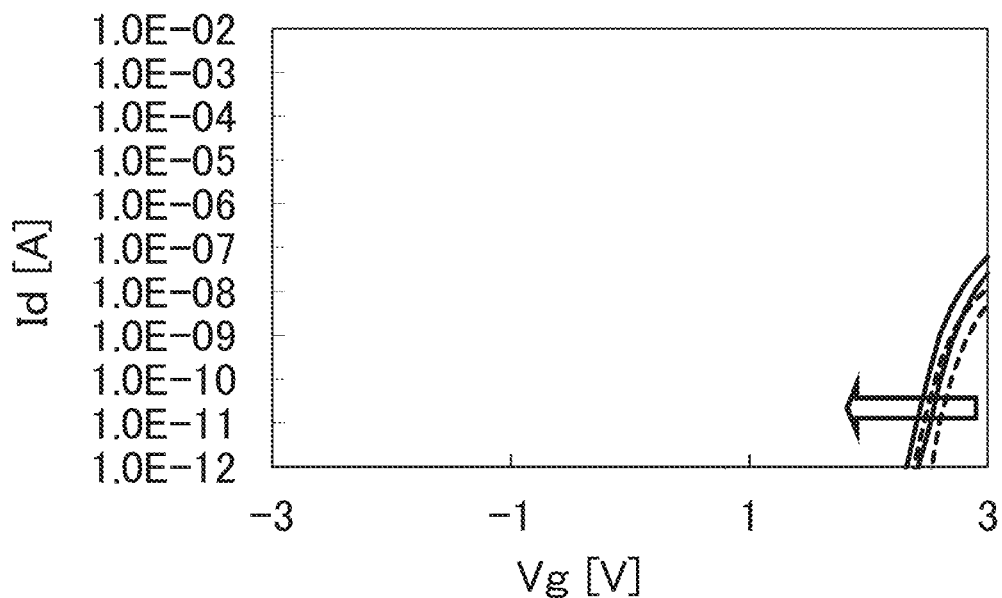
FIGS. 15A and 15B show measurement results of electrical characteristics of transistors formed in Example.
Figure 15B:
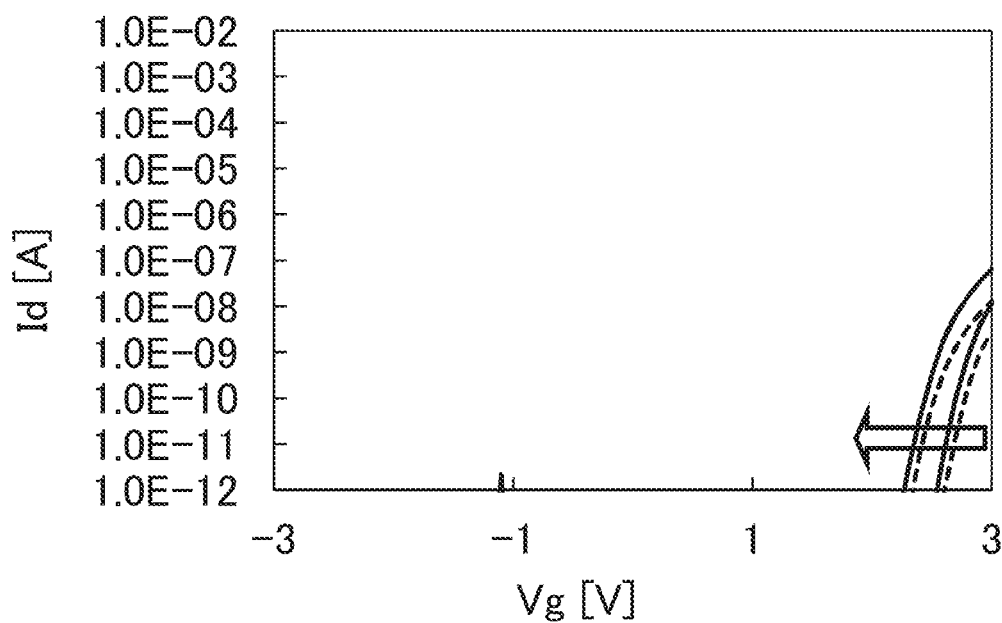

FIGS. 15A and 15B show electrical characteristics before and after the hold test under the first conditions and the second conditions, respectively. The electrical characteristics shown on the line segment side of the arrow represent electrical characteristics before the hold test, and the electrical characteristics shown on the triangle vertex side of the arrow represent electrical characteristics after the hold test. As shown in FIG. 15A, a variation in threshold ΔVth of the transistor by the hold test under the first conditions was −0.07 V. As shown in FIG. 15B, a variation in threshold ΔVth of the transistor by the hold test under the second conditions was −0.14 V. These results show that the threshold hardly shifts by the hold test.

Next, a method for forming Samples 1 to 3 of this example will be described.

First, a 300-nm-thick silicon oxynitride (SiON) layer serving as a base insulating layer was formed by a plasma CVD (PECVD) method over a silicon substrate on a surface of which a 100-nm-thick thermal oxide film is provided. The silicon oxynitride layer was formed under the following conditions: mixed atmosphere of silane and dinitrogen monoxide ($SiH_4:N_2O$=1 sccm: 800 sccm); pressure, 200 Pa, power supply, 150 kW; and substrate temperature, 350° C.

A surface of the silicon oxynitride layer was subjected to polishing treatment. Then, a 20-nm-thick first oxide semiconductor layer and a 15-nm-thick second oxide semiconductor layer were stacked. The first oxide semiconductor layer was formed by a sputtering method using an oxide target of In:Ga:Zn=1:3:2 (atomic ratio) under the following conditions: mixed atmosphere of argon and oxygen (argon:oxygen=30 sccm:15 sccm); pressure, 0.4 Pa; power supply, 0.5 kW; distance between the substrate and the target, 60 mm; and substrate temperature, 200° C. The second oxide semiconductor layer was formed by a sputtering method using an oxide target of In:Ga:Zn=1:1:1 (atomic ratio) under the following conditions: mixed atmosphere of argon and oxygen (argon:oxygen=30 sccm:15 sccm); pressure, 0.4 Pa; power supply, 0.5 kW; distance between the substrate and the target, 60 mm; and substrate temperature, 300° C. Note that the first oxide semiconductor layer and the second oxide semiconductor layer were successively formed without exposure to the air.

Next, heat treatment was performed. The heat treatment was performed under a nitrogen atmosphere at 450° C. for one hour, and then performed under an oxygen atmosphere at 450° C. for one hour.

Next, the first oxide semiconductor layer and the second oxide semiconductor layer were processed into an island shape by inductively coupled plasma (ICP) etching under the following conditions: mixed atmosphere of boron trichloride and chlorine ($BCl_3:Cl_2$=60 sccm:20 sccm); power supply, 450 W; bias power, 100 W; and pressure, 1.9 Pa.

Next, a tungsten layer to be a source electrode and a drain electrode was formed to a thickness of 100 nm over the first oxide semiconductor layer and the second oxide semiconductor layer. The tungsten layer was formed by a sputtering method using a tungsten target under the following conditions: argon (Ar=80 sccm) atmosphere; pressure, 0.8 Pa; power supply (power supply output), 1.0 kW; distance between the silicon substrate and the target, 60 mm; and substrate temperature, 230° C.

Next, a resist mask was formed over the tungsten layer and etching was performed by an ICP etching method. As the etching, first etching, second etching, and third etching were performed. The conditions of the first etching were as follows: mixed atmosphere of carbon tetrafluoride, chlorine, and oxygen ($CF_4:Cl_2:O_2$=45 sccm: 45 sccm:55 sccm); power supply, 3000 W; bias power, 110 W; and pressure, 0.67 Pa. The second etching was performed after the first etching under the following conditions: oxygen atmosphere ($O_2$=100 sccm); power supply, 2000 W; bias power, 0 W; and pressure, 3.0 Pa. The third etching was performed after the second etching under the following conditions: mixed atmosphere of carbon tetrafluoride, chlorine, and oxygen ($CF_4:Cl_2:O_2$=45 sccm:45 sccm:55 sccm); power supply, 3000 W; bias power, 110 W; and pressure, 0.67 Pa. Thus, the source electrode and the drain electrode were formed.

Next, a third oxide semiconductor layer was formed to a thickness of 5 nm over the second oxide semiconductor layer, the source electrode, and the drain electrode. The third oxide semiconductor layer was formed by a sputtering method using an oxide target of In:Ga:Zn=1:3:2 (atomic ratio) under the following conditions: mixed atmosphere of argon and oxygen (argon:oxygen=30 sccm:15 sccm); pressure, 0.4 Pa; power supply, 0.5 kW; distance between the target and the substrate, 60 mm; and substrate temperature, 200° C.

Next, a silicon oxynitride layer with a thickness of 15 nm serving as a first gate insulating layer was formed by a plasma CVD method under the following conditions: mixed atmosphere of silane and dinitrogen monoxide ($SiH_4:N_2O=1$ sccm:800 sccm); pressure, 200 Pa, power supply, 150 kW; and substrate temperature, 350° C. Moreover, a hafnium oxide layer with a thickness of 20 nm or 30 nm serving as a second gate insulating layer was stacked over the silicon oxynitride layer by a sputtering method under the following conditions: mixed atmosphere of argon and oxygen ($Ar:O_2=50$ sccm:0 sccm or 25 sccm:25 sccm); pressure, 0.6 Pa, power supply, 2.5 kW; distance between the target and the substrate, 60 mm; and substrate temperature, 100° C., 200° C., or 350° C.

Next, a tantalum nitride layer was formed to a thickness of 30 nm and a tungsten layer was formed to a thickness of 135 nm by a sputtering method. The deposition conditions of the tantalum nitride layer by a sputtering method were as follows: mixed atmosphere of argon and nitrogen (argon: nitrogen=50 sccm:10 sccm); pressure, 0.6 Pa; power supply, 1 kW; distance between the target and the substrate, 60 mm; and substrate temperature, 25° C. The deposition conditions of the tungsten layer by a sputtering method were as follows: an argon (Ar=100 sccm) atmosphere; pressure, 2.0 Pa; power supply, 4 kW; distance between the target and the substrate, 60 mm; and substrate temperature, 230° C.

Next, the stack of the 30-nm-thick tantalum nitride layer and the 135-nm-thick tungsten layer was etched by an ICP etching method. As the etching, first etching and second etching were performed. The conditions of the first etching were as follows: mixed atmosphere of chlorine, carbon tetrafluoride, and oxygen ($Cl_2:CF_4:O_2=45$ sccm:55 sccm:55 sccm); power supply, 3000 W; bias power, 110 W; and pressure, 0.67 Pa. The second etching was performed after the first etching under the following conditions: a chlorine ($Cl_2=100$ sccm) atmosphere; power supply, 2000 W; bias power, 50 W; and pressure, 0.67 Pa. Thus, a gate electrode was formed.

Next, a stack of the gate insulating layers and the third oxide semiconductor layer was etched using the gate electrode as a mask. The etching was performed under the following conditions: a boron trichloride ($BCl_3=80$ sccm) atmosphere; power supply, 450 W; bias power, 100 W; and pressure, 0.1 Pa.

Next, a 20-nm-thick aluminum oxide layer was formed over the gate electrode by a sputtering method, and a 150-nm-thick silicon oxynitride layer was formed thereover by a CVD method.

Through the above steps, the transistors of Samples 1 to 3 of this example were formed.

Next, a method for forming a comparative sample will be described. The comparative sample has the same structure as Samples 1 to 3 except that the first gate insulating layer is a silicon oxynitride film with a thickness of 20 nm and the second gate insulating layer is not included.

The formation conditions of Samples 1 to 3 and the comparative sample are shown in Table 1.

TABLE 1

|  | Sample 1 | Sample 2 | Sample 3 | Comparative sample |
|---|---|---|---|---|
| First gate insulating film | SiON (15 nm) | SiON (15 nm) | SiON (15 nm) | SiON (20 nm) |
| Second gate insulating film | HfOx (30 nm) | HfOx (20 nm) | HfOx (20 nm) | — |
| Substrate temperature at deposition | 100° C. | 200° C. | 350° C. | — |
| Partial pressure of oxygen at deposition | 0% | 50% | 50% | — |

Next, the above-described stress test was carried out on the comparative sample and Samples 1 to 3. The results are shown in Table 2. The variation in threshold was small in the comparative sample and Sample 1 and large in Samples 2 and 3.

TABLE 2

|  | Comparative sample | Sample 1 | Sample 2 | Sample 3 |
|---|---|---|---|---|
| ΔVth | +0.39 V | +0.24 V | +1.64 V | +1.47 V |

Because Sample 1 includes the hafnium oxide film as the second gate insulating layer as in Samples 2 and 3, this difference in ΔVth is assumably caused by the difference in deposition conditions or the obtained film quality.

Whether the film quality of the hafnium oxide film depends on deposition conditions was examined. A silicon oxynitride (SiON) film with a thickness of 5 nm was formed on a silicon substrate by a plasma CVD (PECVD) method. A hafnium oxide film with a thickness of 30 nm was stacked thereover by a sputtering method in a mixed atmosphere of argon and oxygen ($Ar:O_2=50$ sccm:0 sccm, or 25 sccm:25 sccm) at a pressure of 0.6 Pa, an electric power of 2.5 kW, a distance between a target and the substrate of 60 mm, and substrate temperatures of 100° C., 200° C., and 350° C.

Figure 16A:
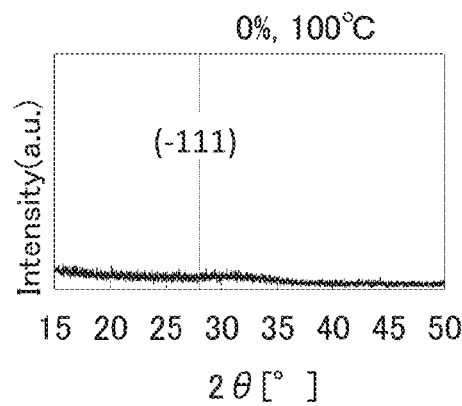
FIGS. 16A to 16F show X-ray diffraction patterns of hafnium oxide films of Example.
Figure 16B:
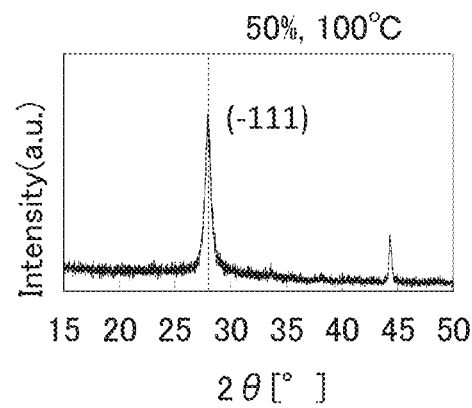
Figure 16C:
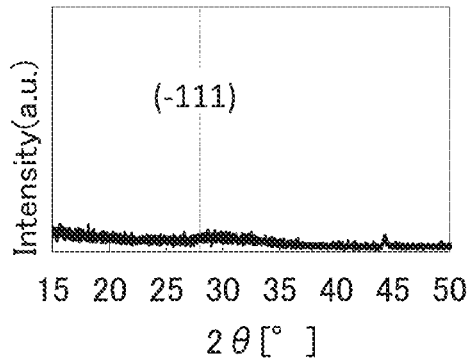
Figure 16D:
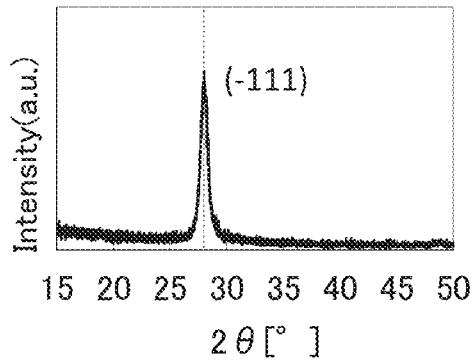
Figure 16E:
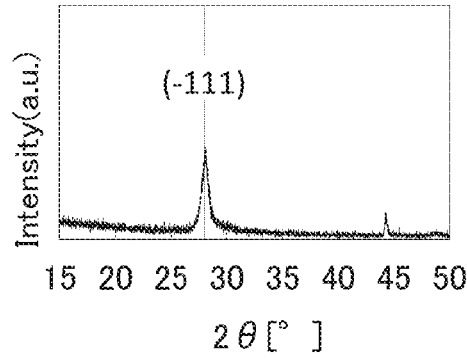
Figure 16F:
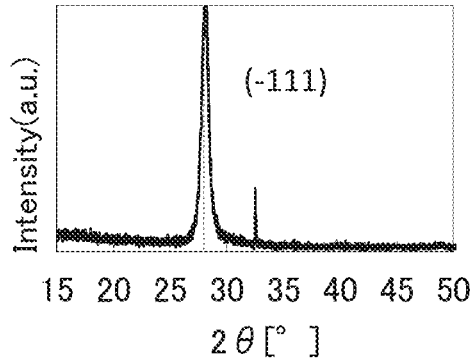

FIGS. 16A to 16F show X-ray diffraction patterns of hafnium oxide films formed under various conditions. FIG. 16A shows the X-ray diffraction pattern of the hafnium oxide film formed at a partial pressure of oxygen of 0% and a substrate temperature of 100° C. FIG. 16B shows that of the hafnium oxide film formed at a partial pressure of oxygen of 50% and a substrate temperature of 100° C. FIG. 16C shows that of the hafnium oxide film formed at a partial pressure of oxygen of 0% and a substrate temperature of 200° C. FIG. 16D shows that of the hafnium oxide film formed at a partial pressure of oxygen of 50% and a substrate temperature of 200° C. FIG. 16E shows that of the hafnium oxide film formed at a partial pressure of oxygen of 0% and a substrate temperature of 350° C. FIG. 16F shows that of the hafnium oxide film formed at a partial pressure of oxygen of 50% and a substrate temperature of 350° C.

As is obvious from the graphs, at the partial pressure of oxygen of 50%, diffraction of (−1,1,1) plane of the hafnium oxide is observed, showing that the hafnium oxide films are crystallized. Even at the partial pressure of oxygen of 0%, when the substrate temperature is 350° C., the hafnium oxide is crystallized. Those diffraction patterns indicate that the crystals of the hafnium oxides are monoclinic.

The second gate insulating layer of Sample 1 was formed under the same conditions as the film showing the X-ray diffraction pattern of FIG. 16A. The second gate insulating layers of Samples 2 and 3 were formed under the same conditions as the films showing the X-ray diffraction patterns of FIG. 16D and FIG. 16F, respectively. Samples 2 and 3 exhibit significant shifts in threshold, which suggest that crystallization of hafnium oxide is a cause of the threshold shift.

Figure 17:
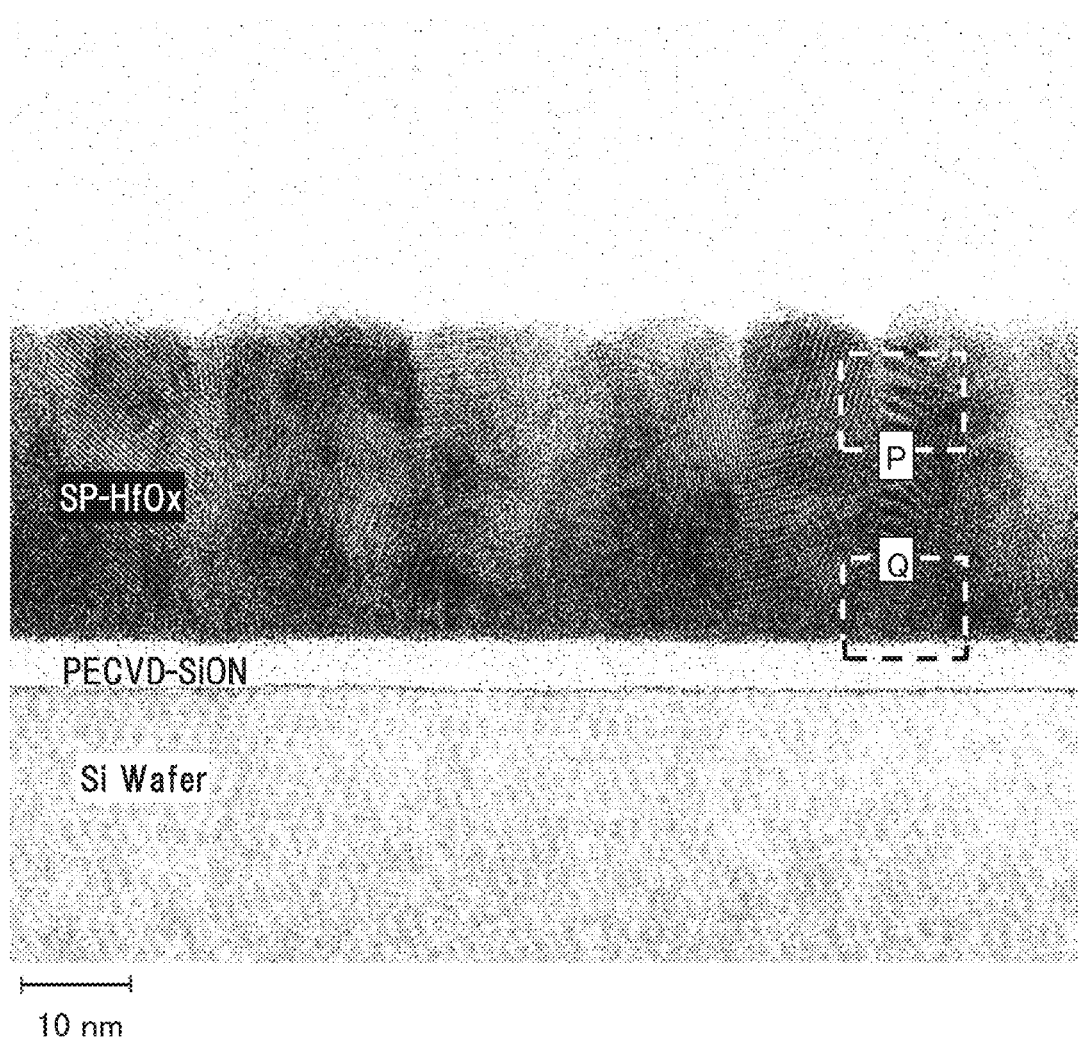
FIG. 17 is a transmission electron microscope image of a hafnium oxide film of Example.
Figure 18A:
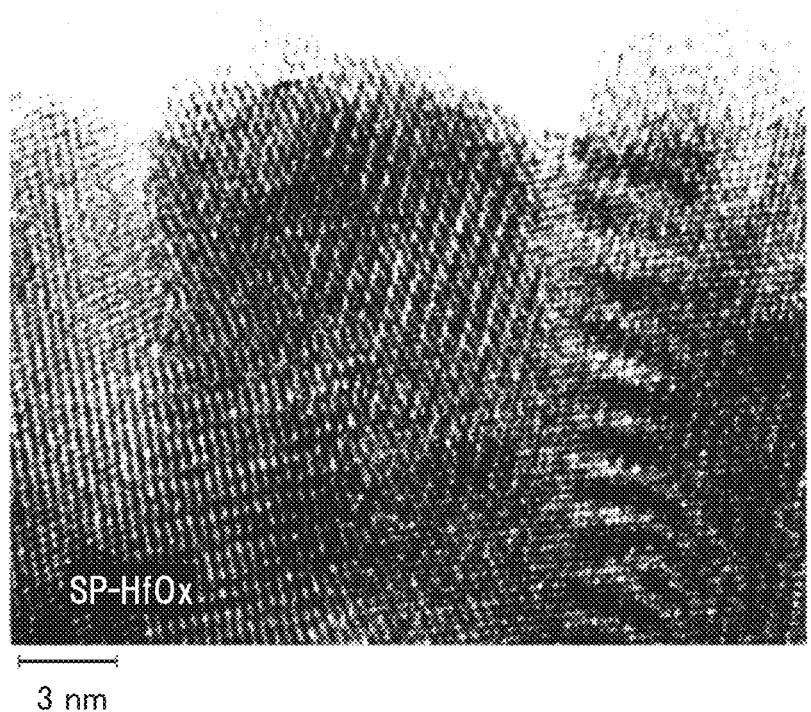
FIGS. 18A and 18B are transmission electron microscope images of a hafnium oxide film of Example.
Figure 18B:
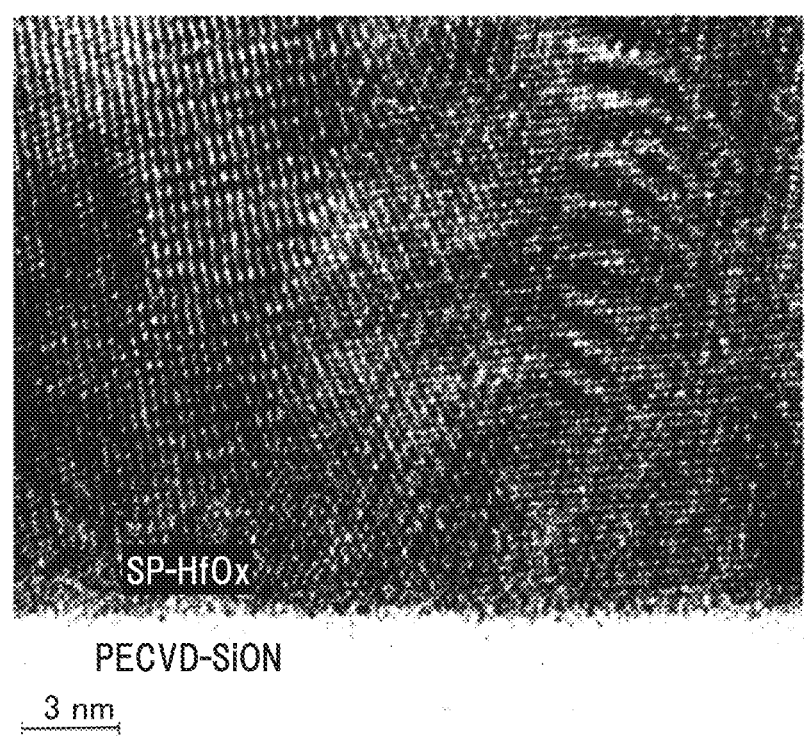
Figure 19A:
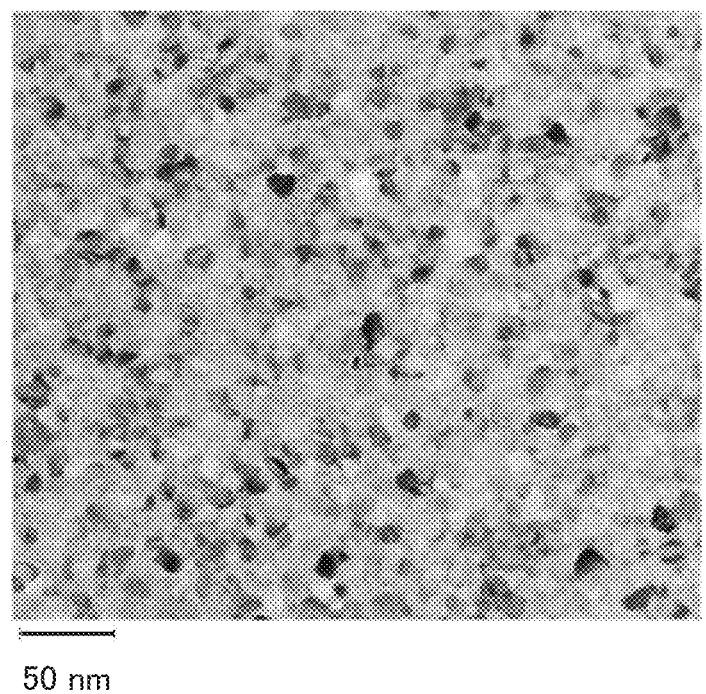
FIGS. 19A and 19B are transmission electron microscope images of a hafnium oxide film of Example.
Figure 19B:

FIG. 17, FIGS. 18A and 18B, FIGS. 19A and 19B are transmission electron microscope (TEM) images of the films showing the X-ray diffraction pattern of FIG. 16D. FIG. 17 shows a TEM image of the hafnium oxide film observed from the direction parallel to the film surface (cross-sectional TEM image), and FIGS. 18A and 18B show enlarged images of a region P and a region Q, respectively, in FIG. 17. FIG. 19A shows a TEM image of the hafnium oxide film observed from the direction perpendicular to the film surface (planar TEM image), and FIG. 19B is a high-magnification image of the planar TEM image.

In the hafnium oxide shown in FIG. 17, FIGS. 18A and 18B, and FIGS. 19A and 19B, the crystal grows in a columnar shape and a crystal grain boundary exists between crystals. This strongly suggests that crystallization of hafnium oxide, especially, the presence of the crystal grain boundary causes the threshold shift.

Furthermore, the effect of deposition conditions on defects was examined by electron spin resonance (ESR) measurement. At a temperature of 10 K, hafnium oxide films were irradiated with microwaves (frequency: 9.47 GHz, power: 0.1 mW) that travel parallel to the hafnium oxide films. These hafnium oxide films were formed over quartz substrates by an RF sputtering method (power: 2.5 kW, pressure at the deposition: 0.6 Pa, distance between the substrate and the target: 60 mm, substrate temperature: 100° C., 200° C., or 350° C., atmosphere: 100% Ar or 50% Ar/50% oxygen, total flow rate of oxygen and argon: 50 sccm). Some of the hafnium oxide films were subjected to baking at a temperature of 300° C., 350° C., or 400° C. in oxygen.

Figure 20:
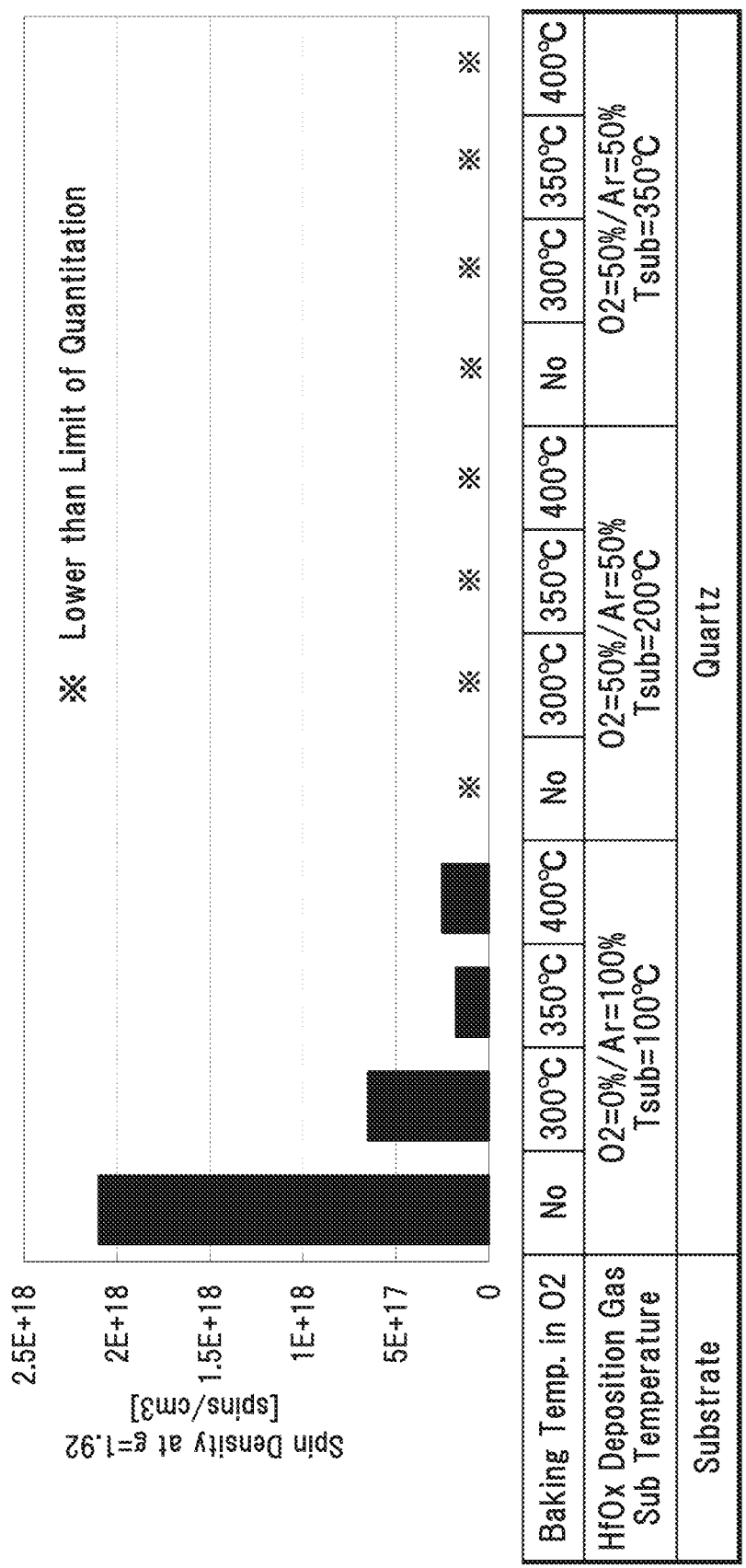
FIG. 20 shows spin densities of hafnium oxide films of Example that are measured by ESR.

In hafnium oxide, the ESR signal attributed to oxygen vacancies is estimated to be at a g value of 1.92 to 1.98. As shown in FIG. 20, the hafnium oxide films formed under rare oxygen conditions (partial pressure of oxygen at the deposition: 0%) have high spin density at a g value of approximately 1.92, and the spin density becomes lower by baking in oxygen. Accordingly, the signal at a g value of 1.92 can be considered due to oxygen vacancies.

The analysis results by Rutherford backscattering spectrometry (RBS) in Table 3 show that the hafnium oxide film formed under rare oxygen conditions (partial pressure of oxygen at the deposition: 0%) includes a lower percentage of oxygen and a higher percentage of argon, which may have been introduced at the deposition, than the hafnium oxide film formed under higher-proportion oxygen conditions (partial pressure of oxygen at the deposition: 50%).

TABLE 3

| HfOx deposition conditions | Composition (atomic %) | | | |
| --- | --- | --- | --- | --- |
| | Hf | O | Ar | others |
| O2 = 0%, Tsub = 100° C. | 31.8 | 66.4 | 1.4 | 0.4 |
| O2 = 50%, Tsub = 200° C. | 31.1 | 68.1 | 0.4 | 0.4 |

Figure 21:
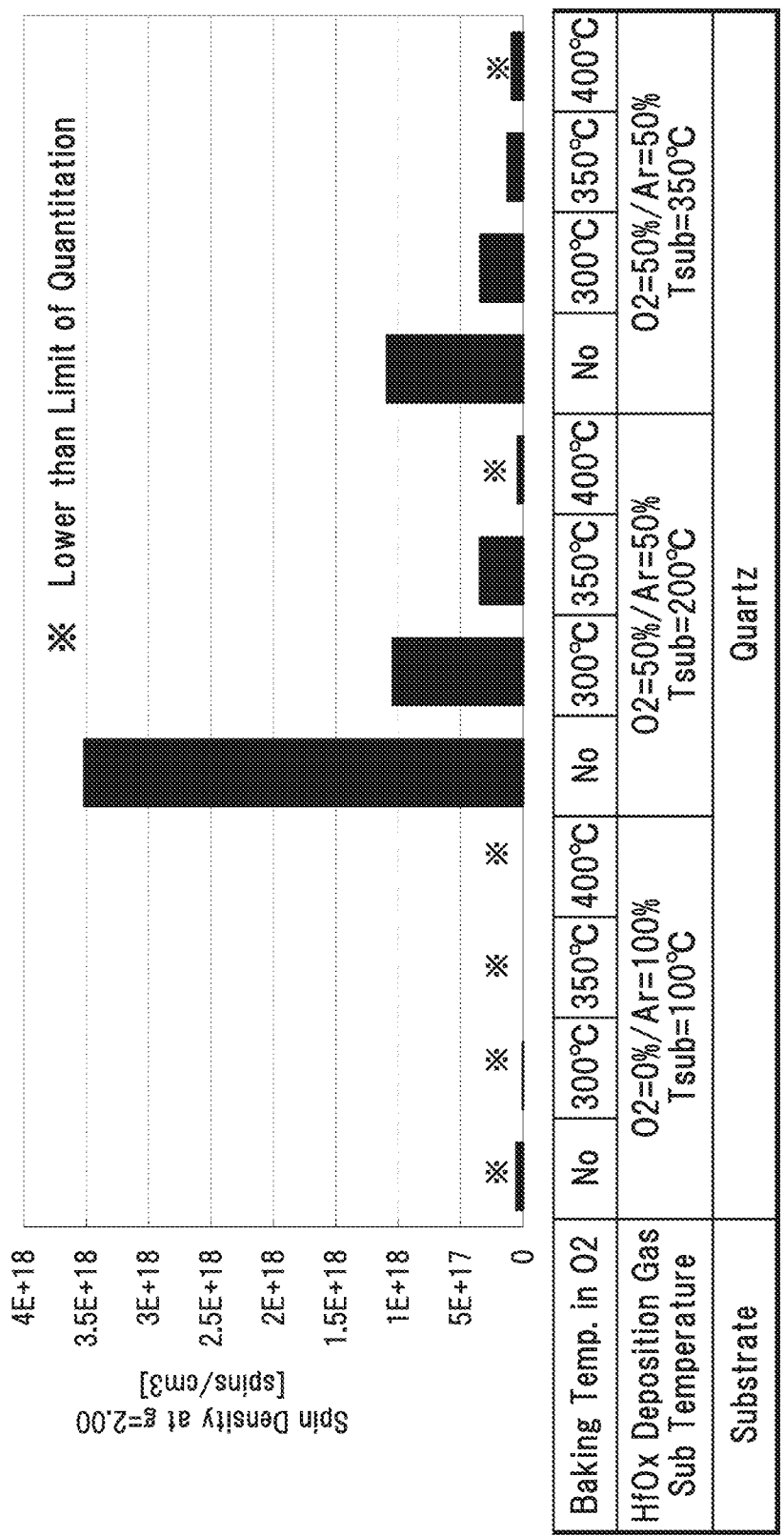
FIG. 21 shows spin densities of hafnium oxide films of Example that are measured by ESR.

In contrast, the spin density at a g value of approximately 1.92 was hardly observed for the hafnium oxide films formed under higher-proportion oxygen conditions (partial pressure of oxygen at the deposition: 50%). As shown in FIG. 21, the hafnium oxide films formed under higher-proportion oxygen conditions (partial pressure of oxygen at the deposition: 50%) has higher spin density at a g value of approximately 2.00 than the hafnium oxide films formed under rare oxygen conditions (partial pressure of oxygen at the deposition: 0%). The signal at a g value of 2.00 can be considered due to excess oxygen.

Reference Example

In this reference example, a transistor was fabricated and an off-state current was measured.

The structure of the transistor of the reference example is the same as the structure of the transistor used in Example except the gate insulating layer and the gate electrode. Only the formation method of the gate insulating layer and the gate electrode is described.

After formation of the third oxide semiconductor layer, a 10-nm-thick silicon oxynitride layer serving as a gate insulating layer was formed by a CVD method under the following conditions: mixed atmosphere of silane and dinitrogen monoxide ($SiH_4$:$N_2O$=1 sccm:800 sccm); pressure, 200 Pa, power supply, 150 kW; distance between the target and the substrate, 28 mm; and substrate temperature, 350° C.

Then, a 10-nm-thick titanium nitride layer and a 10-nm-thick tungsten layer were formed by a sputtering method. The deposition conditions of the titanium nitride layer by a sputtering method were as follows: a nitrogen (nitrogen=50 sccm) atmosphere; pressure, 0.2 Pa; power supply, 12 kW; distance between the target and the substrate, 400 mm; and substrate temperature, 25° C. The deposition conditions of the tungsten layer by a sputtering method were as follows: an argon (Ar=100 sccm) atmosphere; pressure, 2.0 Pa; power supply, 1 kW; distance between the target and the substrate, 60 mm; and substrate temperature, 230° C.

Next, the stack of the 10-nm-thick titanium nitride layer and the 10-nm-thick tungsten layer was etched by an ICP etching method. As the etching, first etching and second etching were performed. The conditions of the first etching were as follows: mixed atmosphere of chlorine, carbon tetrafluoride, and oxygen ($Cl_2$:$CF_4$:$O_2$=45 sccm:55 sccm:55 sccm); power supply, 3000 W; bias power, 110 W; and pressure, 0.67 Pa. The second etching was performed after the first etching under the following conditions: mixed atmosphere of chlorine and boron trichloride ($Cl_2$:$BCl_3$=50 sccm:150 sccm); power supply, 1000 W; bias power, 50 W; and pressure, 0.67 Pa. Thus, a gate electrode was formed.

Through the above steps, the transistor was formed. The channel length of the transistor was 50 nm and the channel width thereof was 40 nm.

Next, the off-state current of the formed transistor was measured.

Because a current smaller than 1 fA cannot be measured directly, 250,000 transistors of reference example were connected in parallel and a substantially one transistor with a channel width of 10 mm (40 nm×250,000) was formed.

Figure 22:
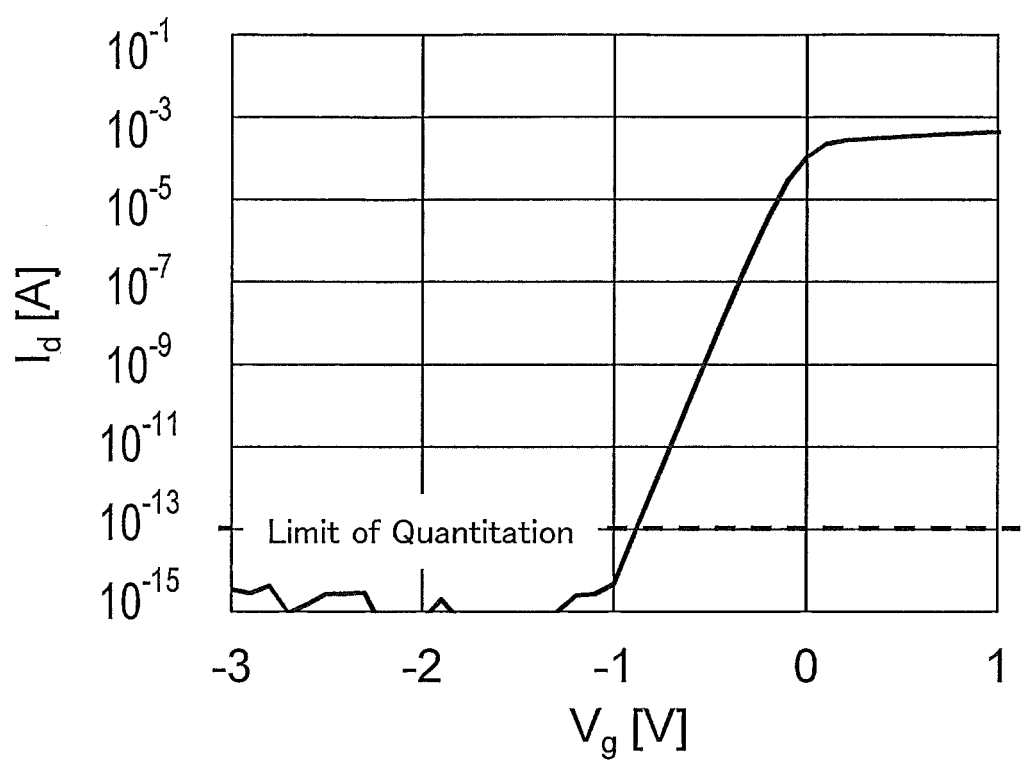
FIG. 22 shows measurement results of electrical characteristics of a transistor formed in a reference example.

FIG. 22 shows Id-Vg characteristics of the transistor with the channel width of 10 mm at a drain potential (Vd: [V]) of 1 V. The off-state current when Vg<−1 V was smaller than $10^{-13}$ A (that is, the off-state current per micrometer of a channel width was lower than $10^{-17}$ A/μm) as shown in FIG. 22.

This application is based on Japanese Patent Application serial no. 2013-182664 filed with Japan Patent Office on Sep. 4, 2013, the entire contents of which are hereby incorporated by reference.

What is claimed is:

1. A method for manufacturing a semiconductor device comprising an electron trap layer between a first semiconductor and a gate electrode, the method comprising the steps of:

forming the electron trap layer by sputtering hafnium oxide, wherein the electron trap layer is formed so that the electron trap layer includes crystallized hafnium oxide;

forming an electrode so as to be electrically connected to the first semiconductor;

forming a second semiconductor; and forming a third semiconductor, wherein the first semiconductor is between the second semiconductor and the third semiconductor, wherein the third semiconductor is between the first semiconductor and the electron trap layer, wherein the sputtering of the hafnium oxide is performed so that the following condition is satisfied:

$$P \geq 45 - 0.15 \times T$$

where T is a substrate temperature in degrees centigrade and P is a proportion of oxygen in an atmosphere in percent, and wherein $0 \leq P \leq 100$.

2. The method according to claim 1, wherein the electron trap layer includes electron trap states.

3. The method according to claim 1, wherein the crystallized hafnium oxide is monoclinic.

4. The method according to claim 1, wherein the electrode is either a source electrode or a drain electrode.

5. The method according to claim 1, wherein the first semiconductor is an oxide semiconductor.

6. The method according to claim 1, further comprising the steps of:

forming a first insulating layer; and forming a second insulating layer, wherein the first insulating layer is between the first semiconductor and the electron trap layer, and wherein the second insulating layer is between the electron trap layer and the gate electrode.

7. The method according to claim 1, wherein $200 \leq T \leq 350$.

8. A method for manufacturing a semiconductor device comprising an electron trap layer between a first semiconductor and a gate electrode, the method comprising the steps of:

forming the electron trap layer by sputtering hafnium oxide, wherein the electron trap layer is formed so that the electron trap layer includes crystallized hafnium oxide;

forming a metal electrode so as to be in direct contact with the first semiconductor;

forming a second semiconductor; and forming a third semiconductor, wherein the first semiconductor is between the second semiconductor and the third semiconductor, wherein the third semiconductor is between the first semiconductor and the electron trap layer, wherein the sputtering of the hafnium oxide is performed so that the following condition is satisfied:

$$P \geq 45 - 0.15 \times T$$

where T is a substrate temperature in degrees centigrade and P is a proportion of oxygen in an atmosphere in percent, and wherein $0 \leq P \leq 100$.

9. The method according to claim 8, wherein the electron trap layer includes electron trap states.

10. The method according to claim 8, wherein the crystallized hafnium oxide is monoclinic.

11. The method according to claim 8, wherein the metal electrode is either a source electrode or a drain electrode.

12. The method according to claim 8, wherein the first semiconductor is an oxide semiconductor.

13. The method according to claim 8, further comprising the steps of:

forming a first insulating layer; and forming a second insulating layer, wherein the first insulating layer is between the first semiconductor and the electron trap layer, and wherein the second insulating layer is between the electron trap layer and the gate electrode.

14. The method according to claim 8, wherein $200 \leq T \leq 350$.

* * * * *

UNITED STATES PATENT AND TRADEMARK OFFICE
CERTIFICATE OF CORRECTION

PATENT NO.         : 9,449,853 B2
APPLICATION NO.    : 14/471766
DATED              : September 20, 2016
INVENTOR(S)        : Yoshitaka Yamamoto et al.

It is certified that error appears in the above-identified patent and that said Letters Patent is hereby corrected as shown below:

In the Specification

At Column 4, Line 22, "agate" should be --a gate--;

At Column 4, Line 23, "102, may" should be --102 may--;

At Column 4, Line 56, "FIG. 23" should be --FIG. 2B--;

At Column 6, Line 30, "the EDT of" should be --the EOT of--;

At Column 7, Line 2, "(ALB)" should be --(ALD)--;

At Column 8, Line 43, "Accordingly;" should be --Accordingly,--;

At Column 8, Line 58, "lower lent." should be --lower Icut.--;

At Column 9, Line 7, "way;" should be --way,--;

At Column 10, Line 8, "rap" should be --trap--;

At Column 11, Line 24, "102e" should be --102c--;

At Column 11, Line 67, "simplicity;" should be --simplicity,--;

At Column 16, Line 58, "ULVAC-PHI." should be --ULVAC-PHI,--;

At Column 22, Line 43, "In-Zn oxide." should be --In-Zn oxide,--;

At Column 22, Line 43, "Al-Zn oxide." should be --Al-Zn oxide,--;

Signed and Sealed this
Third Day of January, 2017

Michelle K. Lee
*Director of the United States Patent and Trademark Office*

CERTIFICATE OF CORRECTION (continued)
U.S. Pat. No. 9,449,853 B2

At Column 22, Lines 49-50, "In-Dy-Zn oxide." should be --In-Dy-Zn oxide,--;

At Column 23, Line 11, "404a." should be --404a,--;

At Column 23, Line 41, "to 100," should be --to 10°,--;

At Column 27, Line 46, "layer 409." should be --layer 409,--.